United States Patent
Saito et al.

(10) Patent No.: US 10,236,175 B2
(45) Date of Patent: Mar. 19, 2019

(54) LIQUID CHEMICAL FOR FORMING PROTECTING FILM

(71) Applicant: Central Glass Company, Limited, Ube-shi, Yamaguchi (JP)

(72) Inventors: Masanori Saito, Matsusaka (JP); Shinobu Arata, Matsusaka (JP); Takashi Saio, Suzuka (JP); Soichi Kumon, Matsusaka (JP); Hidehisa Nanai, Tokyo (JP); Yoshinori Akamatsu, Matsusaka (JP)

(73) Assignee: Central Glass Company, Limited, Ube-shi (JP)

( * ) Notice: Subject to any disclaimer, the term of this patent is extended or adjusted under 35 U.S.C. 154(b) by 204 days.

(21) Appl. No.: 15/264,776

(22) Filed: Sep. 14, 2016

(65) Prior Publication Data
US 2017/0004963 A1    Jan. 5, 2017

Related U.S. Application Data

(62) Division of application No. 12/912,360, filed on Oct. 26, 2010, now Pat. No. 9,478,407.

(30) Foreign Application Priority Data

Oct. 28, 2009  (JP) ................................ 2009-248133
Jan. 29, 2010  (JP) ................................ 2010-018001
(Continued)

(51) Int. Cl.
C11D 11/00    (2006.01)
H01L 21/02    (2006.01)
(Continued)

(52) U.S. Cl.
CPC ........ H01L 21/02068 (2013.01); C11D 1/002 (2013.01); C11D 1/004 (2013.01);
(Continued)

(58) Field of Classification Search
CPC ......... H01L 21/02068; H01L 21/02057; H01L 21/0212; H01L 21/027; H01L 21/306;
(Continued)

(56) References Cited

U.S. PATENT DOCUMENTS 3,957,672 A    5/1976  Zisman et al.
5,326,672 A    7/1994  Tanaka et al.
(Continued)

FOREIGN PATENT DOCUMENTS

EP    1 752 827 A1    2/2007
EP    1 572 856 B1    2/2008
(Continued)

OTHER PUBLICATIONS

International Search Report including partial English translation dated Dec. 28, 2010 and PCT/ISA/237 Form (Eleven (11) pages).
(Continued)

*Primary Examiner* — Sharidan Carrillo
(74) *Attorney, Agent, or Firm* — Crowell & Moring LLP

(57) ABSTRACT

Disclosed is a liquid chemical for forming a water-repellent protecting film on a wafer. The liquid chemical is a liquid chemical containing a water-repellent-protecting-film-forming agent for forming the water-repellent protecting film, at the time of cleaning the wafer which has a finely uneven pattern at its surface and contains at least at a part of a surface of a recessed portion of the uneven pattern at least one kind of matter selected from the group consisting of titanium, titanium nitride, tungsten, aluminum, copper, tin, tantalum nitride, ruthenium and silicon, at least on the surface of the recessed portion. The liquid chemical is characterized in that the water-repellent-protecting-film-forming agent is a water-insoluble surfactant. The water-
(Continued)

repellent protecting film formed with the liquid chemical is capable of preventing a pattern collapse of the wafer, in a cleaning step.

9 Claims, 2 Drawing Sheets

(30) Foreign Application Priority Data

| | | |
|---|---|---|
| Feb. 2, 2010 | (JP) | 2010-020950 |
| Feb. 24, 2010 | (JP) | 2010-039400 |
| Feb. 24, 2010 | (JP) | 2010-039404 |
| Apr. 7, 2010 | (JP) | 2010-088569 |
| Apr. 14, 2010 | (JP) | 2010-093223 |
| May 26, 2010 | (JP) | 2010-120276 |
| Oct. 8, 2010 | (JP) | 2010-228652 |

(51) Int. Cl.

| | |
|---|---|
| *H01L 21/027* | (2006.01) |
| *C11D 1/00* | (2006.01) |
| *C11D 1/04* | (2006.01) |
| *C11D 1/40* | (2006.01) |
| *H01L 21/306* | (2006.01) |
| *H01L 21/311* | (2006.01) |

(52) U.S. Cl.
CPC ............... *C11D 1/04* (2013.01); *C11D 1/40* (2013.01); *C11D 11/0047* (2013.01); *H01L 21/027* (2013.01); *H01L 21/0212* (2013.01); *H01L 21/02057* (2013.01); *H01L 21/306* (2013.01); *H01L 21/31127* (2013.01)

(58) Field of Classification Search
CPC ... H01L 21/31127; C11D 1/002; C11D 1/004; C11D 1/04; C11D 1/40; C11D 11/0047
See application file for complete search history.

(56) References Cited

U.S. PATENT DOCUMENTS

| | | | |
|---|---|---|---|
| 5,374,502 A | | 12/1994 | Tanaka et al. |
| 8,828,144 B2 * | | 9/2014 | Kumon .............. H01L 21/02057 134/1.1 |
| 2003/0039916 A1 | | 2/2003 | Adegawa et al. |
| 2003/0114453 A1 | | 6/2003 | Lacrampe et al. |
| 2004/0158100 A1 | | 8/2004 | Irie et al. |
| 2005/0253916 A1 | | 11/2005 | Poncelet et al. |
| 2006/0166941 A1 | | 7/2006 | Brady |
| 2006/0223318 A1 | | 10/2006 | Tagawa |
| 2008/0026975 A1 | | 1/2008 | Koshiyama et al. |
| 2008/0171440 A1 | | 7/2008 | Kodera et al. |
| 2008/0207743 A1 | | 8/2008 | Lamb et al. |
| 2009/0192065 A1 | | 7/2009 | Korzenski et al. |
| 2009/0311874 A1 | | 12/2009 | Tomita et al. |
| 2010/0075504 A1 * | | 3/2010 | Tomita .............. H01L 21/02057 438/706 |
| 2011/0162680 A1 * | | 7/2011 | Saito ...................... C11D 1/002 134/26 |
| 2011/0214685 A1 * | | 9/2011 | Kumon ..................... B08B 3/00 134/1 |
| 2016/0254140 A1 * | | 9/2016 | Saito ...................... C07F 9/3808 134/22.19 |

FOREIGN PATENT DOCUMENTS

| | | |
|---|---|---|
| JP | 5-299336 A | 11/1993 |
| JP | 7-142349 A | 6/1995 |
| JP | 2007-191509 A | 8/2007 |
| JP | 2008-198958 A | 8/2008 |
| JP | 4403202 B1 | 11/2009 |
| JP | 2010-114414 A | 5/2010 |
| JP | 2010-129932 A | 6/2010 |
| WO | WO 2010/047196 A1 | 4/2010 |

OTHER PUBLICATIONS

Japanese Industrial Standard JIS R 3257, 1999.
Japanese Industrial Standard JIS B 0601, 2003.
Taiwanese Office Action dated Nov. 26, 2013 (Tweny four (24) pages).
European Search Report dated Apr. 30, 2015 (seven (7) pages).
Extended European Search Report issued in counterpart European Application No. 10 826 575.2 dated Nov. 2, 2018 (nine (9) pages).
Dutta K. et al., "Relaxation Phenomena of Polar Non-Polar Liquid Mixtures Under Low and High Frequency Electric Field", Pramana Journal of Physics, Oct. 1, 2003, pp. 759-772, vol. 61, No. 4, Raiganj, India, XP055518224, (14 pages).
Dai J. et al., "Room-Temperature Ionic Liquid as a New Solvent to Prepare High-Quality Dodecanethiol Self-Assembled Monolayers on Polycrystalline Gold", Electrochemistry Communications, Elsevier, Feb. 10, 2008, pp. 587-591, vol. 10, No. 4, Amsterdam, Netherlands, XP022552894, (five (5) pages).

* cited by examiner

LIQUID CHEMICAL FOR FORMING PROTECTING FILM

CROSS REFERENCE TO RELATED APPLICATIONS

This application is a divisional of U.S. patent application Ser. No. 12/912,360, filed Oct. 26, 2010, now U.S. Pat. No. 9,478,407, which claims benefit to Japanese Patent Application Nos. 2009-248133, filed Oct. 28, 2009, 2010-018001, filed Jan. 29, 2010, 2010-020950, filed Feb. 2, 2010, 2010-039400, filed Feb. 24, 2010, 2010-039404, filed Feb. 24, 2010, 2010-088569, filed Apr. 7, 2010, 2010-093223, filed Apr. 14, 2010, 2010-120276, filed May 26, 2010 and 2010-228652, filed Oct. 8, 2010, the entire disclosures of which are hereby incorporated in their entirety.

TECHNICAL FIELD

The present invention relates to a technique of cleaning a substrate (a wafer) in production of semiconductor devices or the like which technique aims to improve the production yield of devices having a circuit pattern which is particularly fine and particularly high in aspect ratio.

BACKGROUND OF THE INVENTION

Semiconductor devices for use in networks or digital household electric appliances are being further desired to be sophisticated, multifunctional, and low in power consumption. Accordingly, the trend toward micro-patterning for circuits has been developed. With this trend, a pattern collapse in a circuit pattern has been getting serious. In the producing of the semiconductor devices, a cleaning step has been heavily used for the purpose of removing contaminants such as particles and metal impurities, so as to occupy up to 30-40% of the whole of the semiconductor fabrication process. If the aspect ratio of the pattern is increased with the trend toward micro-patterning of the semiconductor devices, the pattern is to collapse when a gas-liquid interface passes through the pattern after cleaning or rinsing. This phenomenon is a pattern collapse.

The pattern collapse occurs at the time of drawing the wafer out of a cleaning liquid or a rinsing liquid. The reason thereof is said that a difference in height of residual liquid between a part having a high aspect ratio and that having a low aspect ratio makes a difference in capillary force which acts on the pattern.

Accordingly, the pattern collapse is excepted to be solved by reducing the capillary force to decrease the difference in capillary force due to the difference in height of the residual liquid. The magnitude of the capillary force is the absolute value of P obtained by the equation as shown below. It is expected from this equation that the capillary force can be reduced by decreasing $\gamma$ or $\cos\theta$.

$$P = 2 \times \gamma \times \cos\theta / S$$

($\gamma$: Surface tension, $\theta$: Contact angle, S: Pattern width).

As a method of decreasing $\gamma$ to suppress the pattern collapse, there is disclosed in Patent Publication 1 a technique of changing the cleaning liquid from water to 2-propanol before the gas-liquid interface passes through the pattern.

Additionally, as a method for decreasing $\cos\theta$ to suppress the pattern collapse, there is disclosed in Patent Publication 2 a technique directed toward a resist pattern. This is a method of setting a contact angle to around 90° to bring $\cos\theta$ near to 0 so as to reduce the capillary force as far as possible, thereby suppressing the pattern collapse.

However, the thus disclosed technique is directed toward the resist pattern and is for reforming a resist itself. Moreover, the resist pattern can be finally removed together with the resist, so that it is not necessary to estimate a method of removing a treatment agent after drying; therefore this technique cannot be applied to the present object.

Additionally, in Patent Publication 3, there is disclosed a cleaning method including: surface-reforming a wafer surface in which an uneven pattern is formed with a silicon-containing film, by oxidation and the like; forming a water-repellent protecting film on the surface by using a water-soluble surfactant or a silane coupling agent; reducing the capillary force; and thereby preventing the pattern collapse.

Furthermore, there is disclosed in Patent Publications 4 and 5 a technique of conducting a water repellency-providing treatment in the use of a treatment liquid including a sililation reagent represented by N,N-dimethylaminotrimethylsilane and a solvent thereby preventing the pattern collapse.

REFERENCES ABOUT PRIOR ART

Patent Publication

Patent Publication 1: Japanese Patent Application Publication No. 2008-198958
Patent Publication 2: Japanese Patent Application Publication No. 5-299336
Patent Publication 3: Japanese Patent No. 4403202
Patent Publication 4: Japanese Patent Application Publication No. 2010-129932
Patent Publication 5: International Application Publication 10/47196 Pamphlet

SUMMARY OF THE INVENTION

However, in a wafer having at its surface a finely uneven pattern, in a case where a matter not having at its surface reactive functional groups such as silanol groups sufficiently and being exemplified by a matter formed of at least one kind selected from the group consisting of titanium, titanium nitride, tungsten, aluminum, copper, tin, tantalum nitride, ruthenium and silicon (the matter will be hereinafter referred to as "a metal-based matter") is contained in the wafer at least at a part of a surface of a recessed portion of the uneven pattern (the wafer will be sometimes referred to as merely "a wafer"), a water-repellent protecting film cannot be formed even if using the treatment liquids and the treatment methods disclosed in Patent Publications 1 to 5 and there arises a problem that the pattern collapse cannot be prevented. An object of the present invention is to provide a liquid chemical for forming a protecting film which liquid chemical can form a water-repellent protecting film on the unevenly patterned wafer surface, in order to improve a cleaning step which tends to induce the pattern collapse of the wafer containing the metal-based matter at least at a part of the finely unevenly patterned surface, in the producing of the producing of semiconductor devices.

The liquid chemical of the present invention, for forming the protecting film, is characterized by being a liquid chemical which can form the water-repellent protecting film on the unevenly patterned surface of the wafer (the liquid chemical will be hereinafter referred to as "a liquid chemical for forming a protecting film" or merely "a liquid chemical"). The liquid chemical contains a water-repellent-protectingfilm-forming agent. This agent is for forming the water-repellent protecting film (hereinafter referred to as "a water-repellent protecting film" or merely "a protecting film") when cleaning the wafer containing the metal-based matter at least at a part of the surface of the recessed portion of the uneven pattern among wafers formed having a finely uneven pattern at its surface, at least on the surface of the recessed portion. The liquid chemical is characterized further in that the water-repellent-protecting-film-forming agent is a water-insoluble surfactant. The use of the water-insoluble surfactant makes it possible to form the protecting film on the surface of the wafer containing the metal-based matter and therefore preferable. The surfactant is a substance concurrently including, in a molecule, a hydrophobic moiety and a functional moiety having affinity with the metal-based matter, in which "having affinity with the metal-based matter" means that the metal-based matter is adsorbed by Van der Waals attraction, an electrostatic interaction and the like acting between the surface of the metal-based matter and the functional moiety of the surfactant and/or that the metal-based matter is reacted at its surface with the functional moiety of the surfactant to form a covalent bond thereby being adsorbed. The functional moiety is regarded as a hydrophilic moiety in either of a case of having a property where the water molecule can be added to the functional moiety (a hydration property) and a case of having a property of chemically reacting with water. In these cases, the addition of water to the functional moiety may be an addition established by Van der Waals attraction, the electrostatic interaction or formation of a hydrogen bond or may be an addition established by a covalent bond with the water molecule. The hydrophobic moiety of the surfactant is an atomic group which rejects the water molecule so as not to easily stick to water. Examples thereof are: hydrocarbon group such as alkyl group, phenyl group, naphthyl group and the like; fluoroalkyl group and chloroalkyl group in which hydrogen atoms in these hydrocarbon groups are partially or entirely substituted with halogen atoms; and the like.

In the present invention, a water-soluble surfactant is defined as one in which a mixture liquid obtained when moderately stirred into an equal volume of pure water at 1 atmospheric pressure at a temperature of 20° C. maintains an uniform appearance even after the stirring motion is stopped. On the other hand, the water-insoluble surfactant is defined as one exhibiting a nonuniform appearance under the above-mentioned conditions. Examples of the nonuniform appearance are those who exhibit scattering, phase separation and the like.

The water-insoluble surfactant preferably has an HLB value (Hydrophile Lipophile Balance), obtained by Griffin's method, of from 0.001 to 10. The HLB value by Griffin's method is obtained from the following equation.

*HLB* value=20×the total of formula weight of the hydrophilic moiety/molecular weight An HLB value of less than 0.001 sometimes tends to require a long hours to form the water-repellent protecting film and to form the water-repellent protecting film insufficiently. An HLB value of more than 10 tends to make a water repellency-providing effect insufficient. A more preferable HLB value is 0.005 to 7.

The water-insoluble surfactant is at least one kind selected from the group consisting of those represented by the following general formula [1] or [2] and salt compounds thereof.

[Chemical Formula 4]

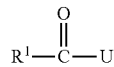

[1]

(In the formula [1], $R^1$ represents a monovalent organic group having hydrocarbon group whose carbon number is 1 to 18 or a monovalent organic group having a fluoroalkyl chain whose carbon number is 1 to 8. U represents a group selected from the group consisting of fluoro group, chloro group, bromo group and iodo group.)

[Chemical Formula 2]

[2]

(In the formula [2], $R^2$ represents a monovalent organic group having hydrocarbon group whose carbon number is 1 to 18 or a monovalent organic group having a fluoroalkyl chain whose carbon number is 1 to 8. $R^3$ represents a hydrogen atom, a monovalent organic group having hydrocarbon group whose carbon number is 1 to 18, or a monovalent organic group having a fluoroalkyl chain whose carbon number is 1 to 8. $R^4$ represents a hydrogen atom, a monovalent organic group having hydrocarbon group whose carbon number is 1 to 18, or a monovalent organic group having a fluoroalkyl chain whose carbon number is 1 to 8.)

It is preferable that the water-insoluble surfactant is at least one kind selected from the group consisting of; a compound in which $R^1$ is a monovalent organic group having hydrocarbon group whose carbon number is 8 to 18 in the water-insoluble surfactant represented by the general formula [1]; a compound in which $R^2$ is a monovalent organic group having hydrocarbon group whose carbon number is 6 to 18, $R^3$ is a hydrogen atom or a monovalent organic group having hydrocarbon group whose carbon number is 1 to 18, and $R^4$ is a hydrogen atom or a monovalent organic group having hydrocarbon group whose carbon number is 1 to 18, in the water-insoluble surfactant represented by the general formula [2]; and a salt compound thereof.

The water-insoluble surfactant which has the hydrophobic moiety formed of a monovalent organic group including hydrocarbon group having a certain carbon number and one functional moiety having affinity with the metal-based matter in a molecule as discussed above is preferable, because hydrophobic moieties become more readily disposed toward the direction apart from the wafer surface at the time of conducting a surface treatment with the liquid chemical containing the surfactant on the wafer containing the metal-based matter, thereby improving the water repellency-providing effect.

Additionally, at least one kind selected from the group consisting of the following general formulas [3] and [4] may be used as the water-insoluble surfactant.

[Chemical Formula 3]

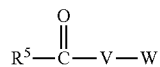

[3]

(In the formula [3], $R^5$ represents a monovalent organic group having hydrocarbon group whose carbon number is 1 to 18 or a monovalent organic group having a fluoroalkyl chain whose carbon number is 1 to 8. V represents an oxygen atom or a sulfur atom. W represents a group selected from the group consisting of a hydrogen atom, alkyl group, aromatic group, pyridyl group, quinolyl group, succinimide group, maleimide group, benzoxazole group, benzothiazole group and benzotriazole group, in which a hydrogen atom in these groups may be substituted with an organic group.)

[Chemical Formula 4]

(In the formula [4], X represents isocyanate group, mercapto group or aldehyde group. a represents an integer of from 1 to 6. $R^6$ represents an organic group having hydrocarbon group whose carbon number is 1 to 18 or an organic group having a fluoroalkyl chain whose carbon number is 1 to 8. This is a compound in which isocyanate group, mercapto group or aldehyde group of which number is a is substituted for the same number of hydrogen atom of $R^6$.)

[Chemical Formula 5]

(In the formula [5], Y represents a ring structure containing sulfur element. $R^7$ represents a group selected from the group consisting of a hydrogen atom, a monovalent organic group having hydrocarbon group whose carbon number is 1 to 18, and a monovalent organic group having a fluoroalkyl chain whose carbon number is 1 to 8.)

[Chemical Formula 6]

(In the formula [6], $R^8$ represents a monovalent organic group having hydrocarbon group whose carbon number is 1 to 18, or a monovalent organic group having a fluoroalkyl chain whose carbon number is 1 to 8. $R^9$ represents a monovalent organic group having hydrocarbon group whose carbon number is 1 to 18, or a monovalent organic group having a fluoroalkyl chain whose carbon number is 1 to 8. Z represents an oxygen atom or a sulfur atom.)

Additionally, the liquid for forming the water-repellent protecting film may contain a diluent solvent. In this case, the concentration of the water-insoluble surfactant in the liquid chemical for forming the water-repellent protecting film is preferably not lower than 0.001 mass % relative to the total quantity of 100 mass % of the liquid chemical. If the concentration is lower than 0.001 mass %, the water repellency-providing effect tends to be insufficient. The concentration is more preferably not lower than 0.008 mass %.

Examples of the wafer having a finely unevenly patterned surface are the wafer which contains, at least at the uneven pattern of the wafer, a matter formed of at least one kind selected from the group consisting of titanium, titanium nitride, tungsten, aluminum, copper, tin, tantalum nitride, ruthenium and silicon. In general, a metal oxide has sufficient hydroxyl groups at its surface. In a case of silicon oxide, for instance, there exist a large number of silanol groups (SiOH groups) at the surface, and these silanol groups serve as reaction points reacted with a silane coupling agent thereby readily forming the protecting film. On the other hand, in the metal-based matter as discussed above, there are not the reaction points corresponding to the silanol groups, so that it is difficult to form the protecting film with a compound such as the silane coupling agent. Additionally, the wafer having a finely unevenly patterned surface in the present invention means a wafer which is in a condition where the finely uneven pattern has already been formed on the surface of the wafer by etching, imprint or the like. Moreover, the wafer may be also directed toward those on which another process such as metal routing has been performed as far as they have a finely uneven pattern at its surface.

The liquid chemical of the present invention is used in such a manner as to substitute the cleaning liquid with the liquid chemical, in the cleaning step for the wafer containing at least at a part of the surface of the recessed portion of the uneven pattern a matter formed of at least one kind selected from the group consisting of titanium, titanium nitride, tungsten, aluminum, copper, tin, tantalum nitride, ruthenium and silicon, among the wafers formed having a finely uneven pattern at its surface. Additionally, the substituted liquid chemical may be substituted with another cleaning liquid.

In the present invention, the liquid chemical for forming the water-repellent protecting film is retained in the recessed portion at the time of cleaning the wafer which contains at least at a part of the surface of the recessed portion of the uneven pattern a matter formed of at least one kind selected from the group consisting of titanium, titanium nitride, tungsten, aluminum, copper, tin, tantalum nitride, ruthenium and silicon, among the wafers formed having a finely uneven pattern at its surface, thereby forming the water-repellent protecting film on the surface of the recessed portion. The present invention provides the water-repellent protecting film characterized in that the water-repellent protecting film is formed from the water-insoluble surfactant serving as the water-repellent-protecting-film-forming agent.

The cleaning liquid is substituted with the liquid chemical for forming the protecting film and the liquid chemical is retained at least in the recessed portion of the uneven pattern as discussed above, during which the protecting film is formed at least on the surface of the recessed portion of the uneven pattern. The protecting film of the present invention may be not necessarily continuously formed and not necessarily uniformly formed. However, it is preferable to form the protecting film continuously and uniformly because more excellent water repellency is obtained thereby.

The protecting film in the present invention means a film formed on the wafer surface so as to reduce the wettability of the wafer surface or to impart water repellency to the same. In the present invention, the water repellency means to decrease a surface energy of a surface of an article thereby weakening the interaction between water or another liquid and the surface of the article (i.e., at the interface) such as a hydrogen bond, intermolecular forces and the like. The effect of reducing the interaction against water is particularly outstanding, but there is also exhibited an effect of reducing the interaction against a mixture liquid of water and a liquid other than water or against a liquid other than water. With such a reduction of the interaction, the contact angle of the liquid to an article surface can be increased.

The present invention provides a method for cleaning the wafer containing at least at a part of the surface of the recessed portion of the uneven pattern a matter formed of at least one kind selected from the group consisting of titanium, titanium nitride, tungsten, aluminum, copper, tin, tantalum nitride, ruthenium and silicon, among the wafers formed having a finely uneven pattern at its surface. The method includes at least:

a protecting film-forming step of retaining the liquid chemical for forming the protecting film at least in the recessed portion of the uneven pattern;

a drying step of drying the uneven pattern thereby removing liquid;

a step of removing the protecting film.

This is a cleaning method characterized in that the liquid chemical for forming the protecting film is the liquid containing the water-repellent-protecting-film-forming agent for forming the protecting film at least on the surface of the recessed portion and that the water-repellent-protecting-film-forming agent is the water-insoluble surfactant.

It is preferable to conduct the removal of the water-repellent protecting film in the film-removing step by at least one treatment selected from irradiating the wafer surface with light, heating the wafer, and exposing the wafer to ozone.

Since the protecting film is formed on the surface of the recessed portion, the capillary force which acts on the recessed portion is to decrease when the cleaning liquid is removed from the recessed portion or when dried up, with which the pattern collapse becomes difficult to occur. Additionally, the protecting film can be removed by at least one treatment selected from irradiating the wafer surface with light, heating the wafer, and exposing the wafer to ozone.

Furthermore, the water-insoluble surfactant preferably has an HLB value obtained by Griffin's method of from 0.001 to 10.

Moreover, it is preferable that the water-insoluble surfactant is at least one kind selected from the group consisting of the following general formula [1], the general formula [2], and a salt compound thereof.

[Chemical Formula 7]

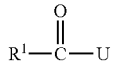

[1]

(In the formula [1], $R^1$ represents a monovalent organic group having hydrocarbon group whose carbon number is 1 to 18 or a monovalent organic group having a fluoroalkyl chain whose carbon number is 1 to 8. U represents a group selected from the group consisting of fluoro group, chloro group, bromo group and iodo group.)

[Chemical Formula 8]

$R^2R^3R^4N$ [2]

(In the formula [2], $R^2$ represents a monovalent organic group having hydrocarbon group whose carbon number is 1 to 18 or a monovalent organic group having a fluoroalkyl chain whose carbon number is 1 to 8. $R^3$ represents a hydrogen atom, a monovalent organic group having hydrocarbon group whose carbon number is 1 to 18, or a monovalent organic group having a fluoroalkyl chain whose carbon number is 1 to 8. $R^4$ represents a hydrogen atom, a monovalent organic group having hydrocarbon group whose carbon number is 1 to 18, or a monovalent organic group having a fluoroalkyl chain whose carbon number is 1 to 8.)

Additionally, it is preferable that the water-insoluble surfactant is at least one kind selected from the group consisting of: a compound in which $R^1$ is a monovalent organic group having hydrocarbon group whose carbon number is 8 to 18 in the water-insoluble surfactant represented by the general formula [1]; a compound in which $R^2$ is a monovalent organic group having hydrocarbon group whose carbon number is 6 to 18, $R^3$ is a hydrogen atom or a monovalent organic group having hydrocarbon group whose carbon number is 1 to 18, and $R^4$ is a hydrogen atom or a monovalent organic group having hydrocarbon group whose carbon number is 1 to 18, in the water-insoluble surfactant represented by the general formula [2]; and a salt compound of these.

Additionally, it is preferable that the water-insoluble surfactant is at least one kind selected from the group consisting of the following general formulas [3] and [4].

[Chemical Formula 9]

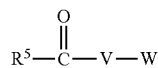

[3]

(In the formula [3], $R^5$ represents a monovalent organic group having hydrocarbon group whose carbon number is 1 to 18 or a monovalent organic group having a fluoroalkyl chain whose carbon number is 1 to 8. V represents an oxygen atom or a sulfur atom. W represents a group selected from the group consisting of a hydrogen atom, alkyl group, aromatic group, pyridyl group, quinolyl group, succinimide group, maleimide group, benzoxazole group, benzothiazole group and benzotriazole group, in which a hydrogen atom in these groups may be substituted with an organic group.)

[Chemical Formula 10]

$R^6(X)_a$ [4]

(In the formula [4], X represents isocyanate group, mercapto group or aldehyde group. a represents an integer of from 1 to 6. $R^6$ represents an organic group having hydrocarbon group whose carbon number is 1 to 18 or an organic group having a fluoroalkyl chain whose carbon number is 1 to 8. This is a compound in which isocyanate group, mercapto group or aldehyde group of which number is a is substituted for the same number of hydrogen atom of $R^6$.)

[Chemical Formula 11]

$R^7$—Y [5]

(In the formula [5], Y represents a ring structure containing sulfur element. $R^7$ represents a group selected from the group consisting of a hydrogen atom, a monovalent organic group having hydrocarbon group whose carbon number is 1 to 18, and a monovalent organic group having a fluoroalkyl chain whose carbon number is 1 to 8.)

[Chemical Formula 12]

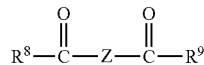

[6]

(In the formula [6], $R^8$ represents a monovalent organic group having hydrocarbon group whose carbon number is 1 to 18, or a monovalent organic group having a fluoroalkyl chain whose carbon number is 1 to 8. $R^9$ represents a monovalent organic group having hydrocarbon group whose carbon number is 1 to 18, or a monovalent organic group having a fluoroalkyl chain whose carbon number is 1 to 8. Z represents an oxygen atom or a sulfur atom.)

Furthermore, it is preferable that the diluent solvent is contained in the liquid chemical for forming the water-repellent protecting film.

Furthermore, it is preferable to conduct the removal of the water-repellent protecting film in the film-removing step by heating the wafer.

Furthermore, it is preferable to conduct the removal of the water-repellent protecting film in the film-removing step by heating the wafer at a temperature of not higher than 300° C.

Furthermore, in a cleaning method including a subsequent cleaning step of substituting the liquid chemical for forming the protecting film with a cleaning liquid different from the liquid chemical, between the protecting film-forming step and the drying step, it is preferable that the cleaning liquid is at least one kind selected from the group consisting of: a water-based cleaning liquid; an organic solvent; a mixture of the water-based cleaning liquid and the organic solvent; and these containing the water-insoluble surfactant used in the liquid chemical for forming the protecting film, at a concentration lower than that in the liquid chemical.

Furthermore, the liquid chemical preferably contains a compound represented by the following general formula [1] as the water-insoluble surfactant.

[Chemical Formula 13]

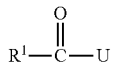

[1]

(In the formula [1], $R^1$ represents a monovalent organic group having hydrocarbon group whose carbon number is 1 to 18 or a monovalent organic group having a fluoroalkyl chain whose carbon number is 1 to 8. U represents a group selected from the group consisting of fluoro group, chloro group, bromo group and iodo group.)

Furthermore, it is preferable that the water-insoluble surfactant represented by the general formula [1] is at least one kind selected from the group consisting of compounds in which $R^1$ is a monovalent organic group having hydrocarbon group whose carbon number is 8 to 18.

Furthermore, it is preferable that the cleaning liquid used in the subsequent cleaning step is at least one kind selected from the group consisting of the water-based cleaning liquid, the organic solvent, and the mixture of the water-based cleaning liquid and the organic solvent.

Furthermore, it is preferable to retain the substituted cleaning liquid in the subsequent cleaning step for 10 seconds or more.

DETAILED DESCRIPTION

Figure 1:
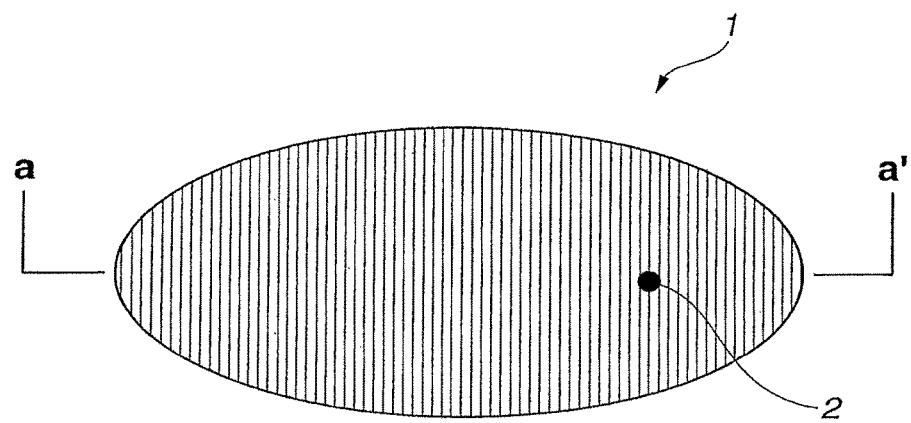
FIG. 1 A schematic plan view of a wafer 1 whose surface is made into a surface having a finely uneven pattern 2.

A protecting film formed by a liquid chemical of the present invention for forming a protecting film is excellent in water repellency. Therefore, in a wafer formed having a finely uneven pattern at its surface, the film reduces the capillary force which acts on the uneven pattern of the wafer containing at least at a part of a surface of a recessed portion of the uneven pattern a matter formed of at least one kind selected from the group consisting of titanium, titanium nitride, tungsten, aluminum, copper, tin, tantalum nitride, ruthenium and silicon, and by extension brings about a pattern collapse-preventing effect. With the use of the liquid chemical, a cleaning step conducted in a process for producing the wafer formed having a finely unevenly patterned surface is improved without lowering throughput. Accordingly, a process for producing the wafer formed having the finely unevenly patterned surface, which is conducted by using the liquid chemical of the present invention, is excellent in productivity.

The liquid chemical of the present invention for forming the protecting film is adaptable to uneven patterns having aspect ratios expected to rise more and more, for example, to an aspect ratio of not less than 7, and therefore allows cost reduction in producing more sophisticated semiconductor devices. In addition to this, the liquid chemical is adaptable without considerably modifying conventional apparatuses, which results in being one appliable in production of various kinds of semiconductor devices.

In general, the cleaning in the use of the liquid chemical of the present invention for forming the protecting film is often conducted upon undergoing pretreatment steps as exemplified by:

a pretreatment step 1 of making the wafer pattern into a finely unevenly patterned surface;

a pretreatment step 2 of cleaning the wafer surface in the use of a water-based cleaning liquid; and a pretreatment step 3 of substituting the water-based cleaning liquid with a cleaning liquid A different from the water-based cleaning liquid (hereinafter referred to as merely "a cleaning liquid A").

Incidentally, each step of the pretreatment steps 1 to 3 may be omitted in some cases.

In the pretreatment step 1 as a pattern-forming method, a resist is applied to the surface of the wafer first of all. Thereafter, the resist is exposed through a resist mask, followed by conducting an etching removal on the exposed resist or an unexposed resist, thereby producing a resist having a desired uneven pattern. Additionally, the resist having an uneven pattern can be obtained also by pushing a mold having a pattern onto the resist. Then, etching is conducted on the wafer. At this time, recessed portions of a resist pattern are etched selectively. Finally, the resist is stripped off thereby obtaining a wafer having a finely uneven pattern.

Incidentally, Examples of the wafer are: those obtained by coating a surface of a silicon wafer, a wafer formed of a plurality of components including silicon and/or silica ($SiO_2$), a silicon carbide wafer, a sapphire wafer, various compound semiconductor wafers, a plastic wafer or the like with a layer formed of a metal-based matter such as titanium, titanium nitride, tungsten, aluminum, copper, tin, tantalum nitride, ruthenium, silicon and the like; those in which at least one layer in a multilayer film formed on the wafer is a layer formed of the metal-based matter; and the like. The uneven patter-forming step is conducted on a layer including the layer formed of the metal-based matter. Additionally, those in which at least a part of the uneven pattern is the metal-based matter at the time of forming the uneven pattern are included also.

Additionally, also relating to the wafer formed of a plurality of components including the metal-based matter, it is possible to form the protecting film on the surface of the metal-based matter. Examples of the wafer formed of a plurality of components further include those in which the metal-based matter is formed on the wafer surface and those in which at least a part of the uneven pattern is the metal-based matter when the uneven pattern is formed. Incidentally, where the protecting film can be formed with the liquid chemical of the present invention is on a surface of the part of the metal-based matter.

Examples of the water-based cleaning liquid include water, and those containing water as a primary component (the water content is not smaller than 50 mass %, for instance) with which at least one kind of the organic solvent, hydrogen peroxide, ozone, acid and alkali is mixed.

Figure 2:
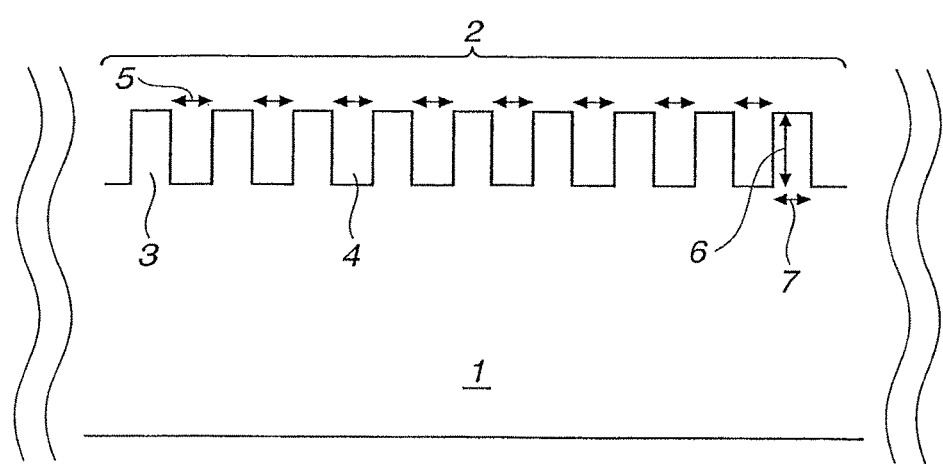
FIG. 2 A view showing a part of a-a' cross section of FIG. 1.

If recessed portions have a small width and projected portions have a large aspect ratio, and if the surface is cleaned with the water-based cleaning liquid in the pretreatment step 2 and subsequently the water-based cleaning liquid is removed by drying and the like or if water is removed by drying and the like after substituting the water-based cleaning liquid with water, a pattern collapse is to easily occur. The uneven pattern is defined as shown in FIG. 1 and FIG. 2. FIG. 1 is a schematic plan view of a wafer 1 whose surface is made into a surface having a finely uneven pattern 2. FIG. 2 shows a part of an a-a' cross section in FIG. 1. A width 5 of recessed portions is defined by an interval between a projected portion 3 and the projected portion 3, as shown in FIG. 2. The aspect ratio of projected portions is expressed by dividing a height 6 of the projected portions by a width 7 of the projected portions. The pattern collapse in the cleaning step is to easily occur when the recessed portions have a width of not more than 70 nm, particularly not more than 45 nm and when the aspect ratio is not less than 4, particularly not less than 6.

The liquid chemical of the present invention for forming the protecting film is the liquid chemical containing a water-repellent-protecting-film-forming agent for forming, at the time of cleaning the wafer which has a finely uneven pattern at its surface and contains at least at a part of the uneven pattern the metal-based matter, a water-repellent protecting film at least on the surface of the recessed portion. In the liquid chemical, the water-repellent-protecting-film-forming agent is the water-insoluble surfactant. The protecting film formed by the liquid chemical is excellent in water repellency, so as to decrease the capillary force acting on the uneven pattern of the wafer, and by extension brings about the pattern collapse-preventing effect.

The cleaning liquid A used in the pretreatment step 3 refers to an organic solvent, a mixture of the organic solvent and the water-based cleaning liquid, and a cleaning liquid into which at least one kind of acid and alkali is mixed. Furthermore, it is preferable to perform a step (the protecting film-forming step) of retaining the liquid chemical for forming the protecting film at least in the recessed portion of the uneven pattern upon substituting the cleaning liquid A with the liquid chemical of the present invention for forming the protecting film. Additionally, the substitution of the cleaning liquid A in the pretreatment step 3 may be conducted 2 or more times. More specifically, the water-based cleaning liquid used in the pretreatment step 2 may be substituted with a first kind of cleaning liquid A, and then the first kind of cleaning liquid A may be substituted successively with various kinds of cleaning liquid A different from the first kind of cleaning liquid A, and then the liquid chemical for forming the protecting film may be substituted therefor. Moreover, in a case where the water-based cleaning liquid used in the pretreatment step 2 can be substituted directly with the liquid chemical for forming the protecting film, the substitution with the cleaning liquid A (the pretreatment step 3) may be omitted.

A cleaning style for the wafer in the present invention is not particularly limited as long as the liquid chemical or the cleaning liquid can be retained at least on the recessed portion of the uneven pattern of the wafer. Examples of the cleaning style for the wafer are: a sheet cleaning style represented by spin cleaning where the wafer is cleaned one by one in such a manner as to dispose the wafer generally horizontally and rotate it while supplying a liquid to the vicinity of the center of the rotation; and a batch style where a plurality of wafer sheets are cleaned in a cleaning bath by being immersed therein. Incidentally, the form of the liquid chemical or the cleaning liquid at the time of supplying the liquid chemical or the cleaning liquid at least to the recessed portion of the uneven pattern of the wafer is not particularly limited as far as it is in the form of liquid at time of being retained on the recessed portion, and may be liquid, vapor or the like, for instance.

Examples of the organic solvent serving as one of the preferable examples of the cleaning liquid A are hydrocarbons, esters, ethers, ketones, halogen-element-containing solvents, sulfoxide-based solvents, alcohols, polyalcohol derivatives, nitrogen-element-containing solvents and the like.

Examples of hydrocarbons are toluene, benzene, xylene, hexane, heptane, octane and the like. Examples of esters are ethyl acetate, propyl acetate, butyl acetate, ethyl acetoacetate and the like. Examples of ethers are diethyl ether, dipropyl ether, dibutyl ether, tetrahydrofuran, dioxane and the like. Examples of ketones are acetone, acetylacetone, methyl ethyl ketone, methyl propyl ketone, methyl butyl ketone, and the like. Examples of the halogen-element-containing solvents are: perfluorocarbons such as perfluorooctane, perfluorononane, perfluorocyclopentane, perfluorocyclohexane, hexafluorobenzene and the like; hydrofluorocarbons such as 1,1,1,3,3-pentafluorobutane, octafluorocyclopentane, 2,3-dihydrodecafluoropentane, ZEORORA-H (produced by ZEON CORPORATION) and the like; hydrofluoroethers such as methyl perfluoroisobutyl ether, methyl perfluorobutyl ether, ethyl perfluorobutyl ether, ethyl perfluoroisobutyl ether, ASAHIKLIN AE-3000 (produced by Asahi Glass Co., Ltd.), Novec HFE-7100, Novec HFE-7200, Novec 7300, Novec 7600 (any of these are produced by 3M Limited) and the like; chlorocarbons such as tetrachloromethane and the like; hydrochlorocarbons such as chloroform and the like; chlorofluorocarbons such as dichlorodifluoromethane and the like; hydrochlorofluorocarbons such as 1,1-dicloro-2,2,3,3,3-pentafluoropropane, 1,3-dichloro-1,1,2,2,3-pentafluoropropane, 1-chloro-3,3,3-trifluoropropene, 1,2-dichloro-3,3,3-trifuoropropene and the like; perfluoroethers; perfluoropolyethers; and the like. Examples of the sulfoxide-based solvents are dimethyl sulfoxide and the like. Examples of the alcohols are methanol, ethanol, propanol, buthanol, ethylene glycol, 1,3-propanediol and the like. Examples of the polyalcohol derivatives are diethylene glycol monoethyl ether, ethylene glycol monomethyl ether, ethylene glycol monobutyl ether, propylene glycol monomethyl ether, propylene glycol monoethyl ether, diethylene glycol monoethyl ether acetate, ethylene glycol monomethyl ether acetate, ethylene glycol monobutyl ether acetate, propylene glycol monomethyl ether acetate, propylene glycol monoethyl ether acetate and the like. Examples of the nitrogen-element-containing solvents are formamide, N,N-dimethylformamide, N,N-dimethylacetamide, N-methyl-2-pyrrolidone, diethylamine, triethylamine, pyridine and the like.

Figure 3:
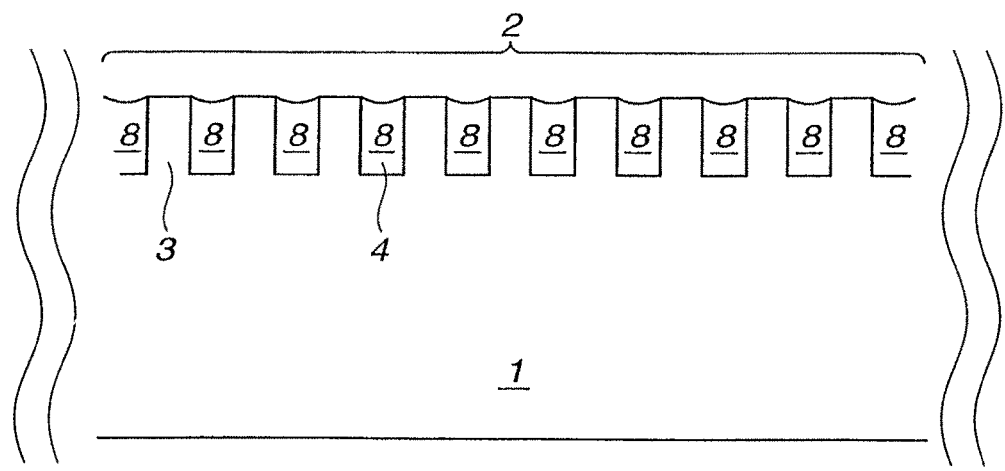
FIG. 3 A schematic view showing a condition where a liquid chemical 8 for forming a protecting film is retained in recessed portions 4 in a cleaning step.

FIG. 3 is a schematic view showing a condition where the liquid chemical 8 for forming the protecting film is retained in recessed portions 4 in the protecting film-forming step. The wafer of the schematic view of FIG. 3 shows a part of the a-a' cross section in FIG. 1. At this time, the liquid chemical for forming the protecting film is provided onto the wafer 1 in which the uneven pattern 2 is formed. At this time, the liquid chemical is brought into a condition retained in the recessed portions 4 as shown in FIG. 3. With this, the protecting film is formed on a surface of the recessed portions 4, thereby imparting water repellency to the surface.

The water-insoluble surfactant preferably has a functional moiety having affinity with the metal-based matter. Examples of the functional moiety having affinity with the metal-based matter are functional moieties including one or more element with unshared electron pair, such as amino group, —(C=O)—U bond, —(C=O)—V—W bond, isocyanate group, mercapto group, aldehyde group, sulfur atom of thiophene group (thienyl group), —(C=O)—Z—(C=O) bond, —OH bond and the like. Here, U represents a group selected from the group consisting of fluoro group, chloro group, bromo group and iodo group. V represents an oxygen atom or a sulfur atom. W represents a group selected from the group consisting of a hydrogen atom, alkyl group, aromatic group, pyridyl group, quinolyl group, succinimide group, maleimide group, benzoxazole group, benzothiazole group and benzotriazole group, in which a hydrogen atom in these groups may be substituted with an organic group. Moreover, Z represents an oxygen atom or a sulfur atom.

Additionally, the water-insoluble surfactant having an HLB value obtained by Griffin's method of from 0.001 to 10 is preferable because it becomes allowed to impart a more excellent water repellency. Examples of such a water-insoluble surfactant includes compounds such as $C_4H_9COF$, $C_5H_{11}COF$, $C_6H_{13}COF$, $C_7H_{15}COF$, $C_8H_{17}COF$, $C_9H_{19}COF$, $C_{10}H_{21}COF$, $C_{11}H_{23}COF$, $C_{12}H_{25}COF$, $C_{13}H_{27}COF$, $C_{14}H_{29}COF$, $C_{15}H_{31}COF$, $C_{16}H_{33}COF$, $C_{17}H_{35}COF$, $C_{18}H_{37}COF$, $C_6H_5COF$, $CF_3COF$, $C_2F_5COF$, $C_3F_7COF$, $C_4F_9COF$, $C_5F_{11}COF$, $C_6F_{13}COF$, $C_7F_{15}COF$, $C_8F_{17}COF$, $C_5H_{11}COCl$, $C_6H_{13}COCl$, $C_7H_{15}COCl$, $C_8H_{17}COCl$, $C_9H_{19}COCl$, $C_{10}H_{21}COCl$, $C_{11}H_{23}COCl$, $C_{12}H_{25}COCl$, $C_{13}H_{27}COCl$, $C_{14}H_{29}COCl$, $C_{15}H_{31}COCl$, $C_{16}H_{33}COCl$, $C_{17}H_{35}COCl$, $C_{18}H_{37}COCl$, $C_6H_5COCl$, $CF_3COCl$, $C_2F_5COCl$, $C_3F_7COCl$, $C_4F_9COCl$, $C_5F_{11}COCl$, $C_6F_{13}COCl$, $C_7F_{15}COCl$, $C_8F_{17}COCl$, $C_8H_{17}COBr$, $C_9H_{19}COBr$, $C_{10}H_{21}COBr$, $C_{11}H_{23}COBr$, $C_{12}H_{25}COBr$, $C_{13}H_{27}COBr$, $C_{14}H_{29}COBr$, $C_{15}H_{31}COBr$, $C_{16}H_{33}COBr$, $C_{17}H_{35}COBr$, $C_{18}H_{37}COBr$, $C_2F_5COBr$, $C_3F_7COBr$, $C_4F_9COBr$, $C_5F_{11}COBr$, $C_6F_{13}COBr$, $C_7F_{15}COBr$, $C_8F_{17}COBr$, $C_{11}H_{23}COI$, $C_{12}H_{25}COI$, $C_{13}H_{27}COI$, $C_{14}H_{29}COI$, $C_{15}H_{31}COI$, $C_{16}H_{33}COI$, $C_{17}H_{35}COI$, $C_{18}H_{37}COI$, $C_3F_7COI$, $C_4F_9COI$, $C_5F_{11}COI$, $C_6F_{13}COI$, $C_7F_{15}COI$, $C_8F_{17}COI$ and the like.

Examples thereof further include compounds such as $C_6H_{13}NH_2$, $C_7H_{15}NH_2$, $C_8H_{17}NH_2$, $C_9H_{19}NH_2$, $C_{10}H_{21}NH_2$, $C_{11}H_{23}NH_2$, $C_{12}H_{25}NH_2$, $C_{13}H_{27}NH_2$, $C_{14}H_{29}NH_2$, $C_{15}H_{31}NH_2$, $C_{16}H_{33}NH_2$, $C_{17}H_{35}NH_2$, $C_{18}H_{37}NH_2$, $CF_3NH_2$, $C_2F_5NH_2$, $C_3F_7NH_2$, $C_4F_9NH_2$, $C_5F_{11}NH_2$, $C_6F_{13}NH_2$, $C_7F_{15}NH_2$, $C_8F_{17}NH_2$, $C_4Cl_9NH_2$, $C_5Cl_{11}NH_2$, $C_6Cl_{13}NH_2$, $C_7Cl_{15}NH_2$, $C_8Cl_{17}NH_2$, $C_4Br_9NH_2$, $C_5Br_{11}NH_2$, $C_6Br_{13}NH_2$, $C_7Br_{15}NH_2$, $C_8Br_{17}NH_2$, $C_4I_9NH_2$, $C_5I_{11}NH_2$, $C_6I_{13}NH_2$, $C_7I_{15}NH_2$, $C_8I_{17}NH_2$, $C_4F_7H_2NH_2$, $C_6F_{11}H_2NH_2$, $C_8F_{15}H_2NH_2$, $C_4Cl_7H_2NH_2$, $C_6Cl_{11}H_2NH_2$, $C_8Cl_{15}H_2NH_2$, $C_4Br_7H_2NH_2$, $C_6Br_{11}H_2NH_2$, $C_8Br_{15}H_2NH_2$, $C_4I_7H_2NH_2$, $C_6I_{11}H_2NH_2$, $C_8I_{15}H_2NH_2$, $C_4F_7Cl_2NH_2$, $C_4F_7Br_2NH_2$, $C_4F_7I_2NH_2$, $(C_3H_7)_2NH$, $(C_4H_9)_2NH$, $(C_5H_{11})_2NH$, $(C_6H_{13})_2NH$, $(C_7H_{15})_2NH$, $(C_8H_{17})_2NH$, $(C_9H_{19})_2NH$, $(C_{10}H_{21})_2NH$, $(C_{11}H_{23})_2NH$, $(C_{12}H_{25})_2NH$, $(C_{13}H_{27})_2NH$, $(C_{14}H_{29})_2NH$, $(C_{15}H_{31})_2NH$, $(C_{16}H_{33})_2NH$, $(C_{17}H_{35})_2NH$, $(C_{18}H_{37})_2NH$, $(CF_3)_2NH$, $(C_2F_5)_2NH$, $(C_3F_7)_2NH$, $(C_4F_9)_2NH$, $(C_5F_{11})_2NH$, $(C_6F_{13})_2NH$, $(C_7F_{15})_2NH$, $(C_8F_{17})_2NH$, $(C_4Cl_9)_2NH$, $(C_5Cl_{11})_2NH$, $(C_6Cl_{13})_2NH$, $(C_7Cl_{15})_2NH$, $(C_8Cl_{17})_2NH$, $(C_4Br_9)_2NH$, $(C_5Br_{11})_2NH$, $(C_6Br_{13})_2NH$, $(C_7Br_{15})_2NH$, $(C_8Br_{17})_2NH$, $(C_4I_9)_2NH$, $(C_5I_{11})_2NH$, $(C_6I_{13})_2NH$, $(C_7I_{15})_2NH$, $(C_8I_{17})_2NH$, $(C_4F_7H_2)_2NH$, $(C_6F_{11}H_2)_2NH$, $(C_8F_{15}H_2)_2NH$, $(C_4Cl_7H_2)_2NH$, $(C_6Cl_{11}H_2)_2NH$, $(C_8Cl_{15}H_2)_2NH$, $(C_4Br_7H_2)_2NH$, $(C_6Br_{11}H_2)_2NH$, $(C_8Br_{15}H_2)_2NH$, $(C_4I_7H_2)_2NH$, $(C_6I_{11}H_2)_2NH$, $(C_8I_{15}H_2)_2NH$, $(C_4F_7Cl_2)_2NH$, $(C_4F_7Br_2)_2NH$, $(C_4F_7I_2)_2NH$, $(C_2H_5)_3N$, $(C_3H_7)_3N$, $(C_4H_9)_3N$, $(C_5H_{11})_3N$, $(C_6H_{13})_3N$, $(C_7H_{15})_3N$, $(C_8H_{17})_3N$, $(C_9H_{19})_3N$, $(C_{10}H_{21})_3N$, $(C_{11}H_{23})_3N$, $(C_{12}H_{25})_3N$, $(C_{13}H_{27})_3N$, $(C_{14}H_{29})_3N$, $(C_{15}H_{31})_3N$, $(C_{16}H_{33})_3N$, $(C_{17}H_{35})_3N$, $(C_{18}H_{37})_3N$, $(CF_3)_3N$, $(C_2F_5)_3N$, $(C_3F_7)_3N$, $(C_4F_9)_3N$, $(C_5F_{11})_3N$, $(C_6F_{13})_3N$, $(C_7F_{15})_3N$, $(C_8F_{17})_3N$, $(C_4Cl_9)_3N$, $(C_5Cl_{11})_3N$, $(C_6Cl_{13})_3N$, $(C_7Cl_{15})_3N$, $(C_8Cl_{17})_3N$, $(C_4Br_9)_3N$, $(C_5Br_{11})_3N$, $(C_6Br_{13})_3N$, $(C_7Br_{15})_3N$, $(C_8Br_{17})_3N$, $(C_4I_9)_3N$, $(C_5I_{11})_3N$, $(C_6I_{13})_3N$, $(C_7I_{15})_3N$, $(C_8I_{17})_3N$, $(C_4F_7H_2)_3N$, $(C_6F_{11}H_2)_3N$, $(C_8F_{15}H_2)_3N$, $(C_4Cl_7H_2)_3N$, $(C_6Cl_{11}H_2)_3N$, $(C_8Cl_{15}H_2)_3N$, $(C_4Br_7H_2)_3N$, $(C_6Br_{11}H_2)_3N$, $(C_8Br_{15}H_2)_3N$, $(C_4I_7H_2)_3N$, $(C_6I_{11}H_2)_3N$, $(C_8I_{15}H_2)_3N$, $(C_4F_7Cl_2)_3N$, $(C_4F_7Br_2)_3N$, $(C_4F_7I_2)_3N$, $(C_5H_{11})(CH_3)NH$, $(C_6H_{13})(CH_3)NH$, $(C_7H_{15})(CH_3)NH$, $(C_8H_{17})(CH_3)NH$, $(C_9H_{19})(CH_3)NH$, $(C_{10}H_{21})(CH_3)NH$, $(C_{11}H_{23})(CH_3)NH$, $(C_{12}H_{25})(CH_3)NH$, $(C_{13}H_{27})(CH_3)NH$, $(C_{14}H_{29})(CH_3)NH$, $(C_{15}H_{31})(CH_3)NH$, $(C_{16}H_{33})(CH_3)NH$, $(C_{17}H_{35})(CH_3)NH$, $(C_{18}H_{37})(CH_3)NH$, $(CF_3)(CH_3)NH$, $(C_2F_5)(CH_3)NH$, $(C_3F_7)(CH_3)NH$, $(C_4F_9)(CH_3)NH$, $(C_5F_{11})(CH_3)NH$, $(C_6F_{13})(CH_3)NH$, $(C_7F_{15})(CH_3)NH$, $(C_8F_{17})(CH_3)NH$, $(C_3H_7)(CH_3)_2N$, $(C_4H_9)(CH_3)_2N$, $(C_5H_{11})(CH_3)_2N$, $(C_6H_{13})(CH_3)_2N$, $(C_7H_{15})(CH_3)_2N$, $(C_8H_{17})(CH_3)_2N$, $(C_9H_{19})(CH_3)_2N$, $(C_{10}H_{21})(CH_3)_2N$, $(C_{11}H_{23})(CH_3)_2N$, $(C_{12}H_{25})(CH_3)_2N$, $(C_{13}H_{27})(CH_3)_2N$, $(C_{14}H_{29})(CH_3)_2N$, $(C_{15}H_{31})(CH_3)_2N$, $(C_{16}H_{33})(CH_3)_2N$, $(C_{17}H_{35})(CH_3)_2N$, $(C_{18}H_{37})(CH_3)_2N$, $(CF_3)(CH_3)_2N$, $(C_2F_5)(CH_3)_2N$, $(C_3F_7)(CH_3)_2N$, $(C_4F_9)(CH_3)_2N$, $(C_5F_{11})(CH_3)_2N$, $(C_6F_{13})(CH_3)_2N$, $(C_7F_{15})(CH_3)_2N$, $(C_8F_{17})(CH_3)_2N$ and the like; their inorganic acid salts such as carbonates, hydrochlorides, sulfates, nitrates and the like; and their organic acid salts such as acetates, propionates, butyrates, phthalates and the like. Incidentally, in a case of forming a salt, the surfactant preferably has a HLB value of from 0.001 to 10 before forming the salt.

Examples thereof further include compounds such as $C_5H_{11}COOH$, $C_6H_{13}COOH$, $C_7H_{15}COOH$, $C_8H_{17}COOH$, $C_9H_{19}COOH$, $C_{10}H_{21}COOH$, $C_{11}H_{23}COOH$, $C_{12}H_{25}COOH$, $C_{13}H_{27}COOH$, $C_{14}H_{29}COOH$, $C_{15}H_{31}COOH$, $C_{16}H_{33}COOH$, $C_{17}H_{35}COOH$, $C_{18}H_{37}COOH$, $C_6H_5COOH$, $C_5F_{11}COOH$, $C_6F_{13}COOH$, $C_7F_{15}COOH$, $C_8F_{17}COOH$, $C_2H_5COOCH_3$, $C_3H_7COOCH_3$, $C_4H_9COOCH_3$, $C_5H_{11}COOCH_3$, $C_6H_{13}COOCH_3$, $C_7H_{15}COOCH_3$, $C_8H_{17}COOCH_3$, $C_9H_{19}COOCH_3$, $C_{10}H_{21}COOCH_3$, $C_{11}H_{23}COOCH_3$, $C_{12}H_{25}COOCH_3$, $C_{13}H_{27}COOCH_3$, $C_{14}H_{29}COOCH_3$, $C_{15}H_{31}COOCH_3$, $C_{16}H_{33}COOCH_3$, $C_{17}H_{35}COOCH_3$, $C_{18}H_{37}COOCH_3$, $C_6H_5COOCH_3$, $CF_3COOCH_3$, $C_2F_5COOCH_3$, $C_3F_7COOCH_3$, $C_4F_9COOCH_3$, $C_5F_{11}COOCH_3$, $C_6F_{13}COOCH_3$, $C_7F_{15}COOCH_3$, $C_8F_{17}COOCH_3$, $CH_3COOC_2H_5$, $C_2H_5COOC_2H_5$, $C_3H_7COOC_2H_5$, $C_4H_9COOC_2H_5$, $C_5H_{11}COOC_2H_5$, $C_6H_{13}COOC_2H_5$, $C_7H_{15}COOC_2H_5$, $C_8H_{17}COOC_2H_5$, $C_9H_{19}COOC_2H_5$, $C_{10}H_{21}COOC_2H_5$, $C_{11}H_{23}COOC_2H_5$, $C_{12}H_{25}COOC_2H_5$, $C_{13}H_{27}COOC_2H_5$, $C_{14}H_{29}COOC_2H_5$, $C_{15}H_{31}COOC_2H_5$, $C_{16}H_{33}COOC_2H_5$, $C_{17}H_{35}COOC_2H_5$, $C_{18}H_{37}COOC_2H_5$, $C_6H_5COOC_2H_5$, $CF_3COOC_2H_5$, $C_2F_5COOC_2H_5$, $C_3F_7COOC_2H_5$, $C_4F_9COOC_2H_5$, $C_5F_{11}COOC_2H_5$, $C_6F_{13}COOC_2H_5$, $C_7F_{15}COOC_2H_5$, $C_8F_{17}COOC_2H_5$, $CH_3COOC_6H_5$, $C_2H_5COOC_6H_5$, $C_3H_7COOC_6H_5$, $C_4H_9COOC_6H_5$, $C_5H_{11}COOC_6H_5$, $C_6H_{13}COOC_6H_5$, $C_7H_{15}COOC_6H_5$, $C_8H_{17}COOC_6H_5$, $C_9H_{19}COOC_6H_5$, $C_{10}H_{21}COOC_6H_5$, $C_{11}H_{23}COOC_6H_5$, $C_{12}H_{25}COOC_6H_5$, $C_{13}H_{27}COOC_6H_5$, $C_{14}H_{29}COOC_6H_5$, $C_{15}H_{31}COOC_6H_5$, $C_{16}H_{33}COOC_6H_5$, $C_{17}H_{35}COOC_6H_5$, $C_{18}H_{37}COOC_6H_5$, $C_6H_5COOC_6H_5$, $CF_3COOC_6H_5$, $C_2F_5COOC_6H_5$, $C_3F_7COOC_6H_5$, $C_4F_9COOC_6H_5$, $C_5F_{11}COOC_6H_5$, $C_6F_{13}COOC_6H_5$, $C_7F_{15}COOC_6H_5$, $C_8F_{17}COOC_6H_5$, $C_5H_{11}COSH$, $C_6H_{13}COSH$, $C_7H_{15}COSH$, $C_8H_{17}COSH$, $C_9H_{19}COSH$, $C_{10}H_{21}COSH$, $C_{11}H_{23}COSH$, $C_{12}H_{25}COSH$, $C_{13}H_{27}COSH$, $C_{14}H_{29}COSH$, $C_{15}H_{31}COSH$, $C_{16}H_{33}COSH$, $C_{17}H_{35}COSH$, $C_{18}H_{37}COSH$, $C_6H_5COSH$, $C_4F_9COSH$, $C_5F_{11}COSH$, $C_6F_{13}COSH$, $C_7F_{15}COSH$, $C_8F_{17}COSH$, $C_4H_9COSCH_3$, $C_5H_{11}COSCH_3$, $C_6H_{13}COSCH_3$, $C_7H_{15}COSCH_3$, $C_8H_{17}COSCH_3$, $C_9H_{19}COSCH_3$, $C_{10}H_{21}COSCH_3$, $C_{11}H_{23}COSCH_3$, $C_{12}H_{25}COSCH_3$, $C_{13}H_{27}COSCH_3$, $C_{14}H_{29}COSCH_3$, $C_{15}H_{31}COSCH_3$, $C_{16}H_{33}COSCH_3$, $C_{17}H_{35}COSCH_3$, $C_{18}H_{37}COSCH_3$, $C_6H_5COSCH_3$, $CF_3COSCH_3$, $C_2F_5COSCH_3$, $C_3F_7COSCH_3$, $C_4F_9COSCH_3$, $C_5F_{11}COSCH_3$, $C_6F_{13}COSCH_3$, $C_7F_{15}COSCH_3$, $C_8F_{17}COSCH_3$ and the like.

Additionally, examples thereof further include compounds such as $C_3H_7NCO$, $C_4H_9NCO$, $C_5H_{11}NCO$, $C_6H_{13}NCO$, $C_7H_{15}NCO$, $C_8H_{17}NCO$, $C_9H_{19}NCO$, $C_{10}H_{21}NCO$, $C_{11}H_{23}NCO$, $C_{12}H_{25}NCO$, $C_{13}H_{27}NCO$, $C_{14}H_{29}NCO$, $C_{15}H_{31}NCO$, $C_{16}H_{33}NCO$, $C_{17}H_{35}NCO$, $C_{18}H_{37}NCO$, $CF_3NCO$, $C_2F_5NCO$, $C_3F_7NCO$, $C_4F_9NCO$, $C_5F_{11}NCO$, $C_6F_{13}NCO$, $C_7F_{15}NCO$, $C_8F_{17}NCO$, $C_6H_{12}(NCO)_2$, $C_7H_{14}(NCO)_2$, $C_8H_{16}(NCO)_2$, $C_9H_{18}(NCO)_2$, $C_{10}H_{20}(NCO)_2$, $C_{11}H_{22}(NCO)_2$, $C_{12}H_{24}(NCO)_2$, $C_{13}H_{26}(NCO)_2$, $C_{14}H_{28}(NCO)_2$, $C_{15}H_{30}(NCO)_2$, $C_{16}H_{32}(NCO)_2$, $C_{17}H_{34}(NCO)_2$, $C_{18}H_{36}(NCO)_2$, $(NCO)C_6H_{12}NCO$, $(NCO)C_7H_{14}NCO$, $(NCO)C_8H_{16}NCO$, $(NCO)C_9H_{18}NCO$, $(NCO)C_{10}H_{20}NCO$, $(NCO)C_{11}H_{22}NCO$, $(NCO)C_{12}H_{24}NCO$, $(NCO)C_{13}H_{26}NCO$, $(NCO)C_{14}H_{28}NCO$, $(NCO)C_{15}H_{30}NCO$, $(NCO)C_{16}H_{32}NCO$, $(NCO)C_{17}H_{34}NCO$, $(NCO)C_{18}H_{36}NCO$, $C_{10}H_{19}(NCO)_3$, $C_{11}H_{21}(NCO)_3$, $C_{12}H_{23}(NCO)_3$, $C_{13}H_{25}(NCO)_3$, $C_{14}H_{27}(NCO)_3$, $C_{15}H_{29}(NCO)_3$, $C_{16}H_{31}(NCO)_3$, $C_{17}H_{33}(NCO)_3$, $C_{18}H_{35}(NCO)_3$, $(NCO)_2C_{13}H_{24}(NCO)_2$, $(NCO)_2C_{14}H_{26}(NCO)_2$, $(NCO)_2C_{15}H_{28}(NCO)_2$, $(NCO)_2C_{16}H_{30}(NCO)_2$, $(NCO)_2C_{17}H_{32}(NCO)_2$, $(NCO)_2C_{18}H_{34}(NCO)_2$, $C_3H_7SH$, $C_4H_9SH$, $C_5H_{11}SH$, $C_6H_{13}SH$, $C_7H_{15}SH$, $C_8H_{17}SH$, $C_9H_{19}SH$, $C_{10}H_{21}SH$, $C_{11}H_{23}SH$, $C_{12}H_{25}SH$, $C_{13}H_{27}SH$, $C_{14}H_{29}SH$, $C_{15}H_{31}SH$, $C_{16}H_{33}SH$, $C_{17}H_{35}SH$, $C_{18}H_{37}SH$, $CF_3SH$, $C_2F_5SH$, $C_3F_7SH$, $C_4F_9SH$, $C_5F_{11}SH$, $C_6F_{13}SH$, $C_7F_{15}SH$, $C_8F_{17}SH$, $C_5H_{10}(SH)_2$, $C_6H_{12}(SH)_2$, $C_7H_{14}(SH)_2$, $C_8H_{16}(SH)_2$, $C_9H_{18}(SH)_2$, $C_{10}H_{20}(SH)_2$, $C_{11}H_{22}(SH)_2$, $C_{12}H_{24}(SH)_2$, $C_{13}H_{26}(SH)_2$, $C_{14}H_{28}(SH)_2$, $C_{15}H_{30}(SH)_2$, $C_{16}H_{32}(SH)_2$, $C_{17}H_{34}(SH)_2$, $C_{18}H_{36}(SH)_2$, $(SH)C_5H_{10}SH$, $(SH)C_6H_{12}SH$, $(SH)C_7H_{14}SH$, $(SH)C_8H_{16}SH$, $(SH)C_9H_{18}SH$, $(SH)C_{10}H_{20}SH$, $(SH)C_{11}H_{22}SH$, $(SH)C_{12}H_{24}SH$, $(SH)C_{13}H_{26}SH$, $(SH)C_{14}H_{28}SH$, $(SH)C_{15}H_{30}SH$, $(SH)C_{16}H_{32}SH$, $(SH)C_{17}H_{34}SH$, $(SH)C_{18}H_{36}SH$, $C_8H_{15}(SH)_3$, $C_9H_{17}(SH)_3$, $C_{10}H_{19}(SH)_3$, $C_{11}H_{21}(SH)_3$, $C_{12}H_{23}(SH)_3$, $C_{13}H_{25}(SH)_3$, $C_{14}H_{27}(SH)_3$, $C_{15}H_{29}(SM$, $C_{16}H_{31}(SH)_3$, $C_{17}H_{33}(SH)_3$, $C_{18}H_{35}(SH)_3$, $(SH)_2C_{10}H_{18}(SH)_2$, $(SH)_2C_{11}H_{20}(SH)_2$, $(SH)_2C_{12}H_{22}(SH)_2$, $(SH)_2C_{13}H_{24}(SH)_2$, $(SH)_2C_{14}H_{26}(SH)_2$, $(SH)_2C_{15}H_{28}(SH)_2$, $(SH)_2C_{16}H_{30}(SH)_2$, $(SH)_2C_{17}H_{32}(SH)_2$, $(SH)_2C_{18}H_{34}(SH)_2$, $C_2H_5CHO$, $C_3H_7CHO$, $C_4H_9CHO$, $C_5H_{11}CHO$, $C_6H_{13}CHO$, $C_7H_{15}CHO$, $C_8H_{17}CHO$, $C_9H_{19}CHO$, $C_{10}H_{21}CHO$, $C_{11}H_{23}CHO$, $C_{12}H_{25}CHO$, $C_{13}H_{27}CHO$, $C_{14}H_{29}CHO$, $C_{15}H_{31}CHO$, $C_{16}H_{33}CHO$, $C_{17}H_{35}CHO$, $C_{18}H_{37}CHO$, $C_6H_5CHO$, $CF_3CHO$, $C_2F_5CHO$, $C_3F_7CHO$, $C_4F_9CHO$, $C_5F_{11}CHO$, $C_6F_{13}CHO$, $C_7F_{15}CHO$, $C_8F_{17}CHO$ and the like.

Additionally, examples thereof further include compounds such as $C_4H_4S$, $CH_3C_4H_3S$, $C_2H_5C_4H_3S$, $C_3H_7C_4H_3S$, $C_4H_9C_4H_3S$, $C_5H_{11}C_4H_3S$, $C_6H_{13}C_4H_3S$, $C_7H_{15}C_4H_3S$, $C_8H_{17}C_4H_3S$, $C_9H_{19}C_4H_3S$, $C_{10}H_{21}C_4H_3S$, $C_{11}H_{23}C_4H_3S$, $C_{12}H_{25}C_4H_3S$, $C_{13}H_{27}C_4H_3S$, $C_{14}H_{29}C_4H_3S$, $C_{15}H_{31}C_4H_3S$, $C_{16}H_{33}C_4H_3S$, $C_{17}H_{35}C_4H_3S$, $C_{18}H_{37}C_4H_3S$, $C_3H_3NS$, $CH_3C_3H_2NS$, $C_2H_5C_3H_2NS$, $C_3H_7C_3H_2NS$, $C_4H_9C_3H_2NS$, $C_5H_{11}C_3H_2NS$, $C_6H_{13}C_3H_2NS$, $C_7H_{15}C_3H_2NS$, $C_8H_{17}C_3H_2NS$, $C_9H_{19}C_3H_2NS$, $C_{10}H_{21}C_3H_2NS$, $C_{11}H_{23}C_3H_2NS$, $C_{12}H_{25}C_3H_2NS$, $C_{13}H_{27}C_3H_2NS$, $C_{14}H_{29}C_3H_2NS$, $C_{15}H_{31}C_3H_2NS$, $C_{16}H_{33}C_3H_2NS$, $C_{17}H_{35}C_3H_2NS$, $C_{18}H_{37}C_3H_2NS$ and the like. Incidentally, $C_4H_4S$ means a thiophene ring. $C_3H_3NS$ means thiazole. $C_3H_2NS$ means a thiazole ring.

Additionally, examples thereof further include compounds such as $C_3H_7COOCOC_3H_7$, $C_4H_9COOCOC_4H_9$, $C_5H_{11}COOCOC_5H_{11}$, $C_6H_{13}COOCOC_6H_{13}$, $C_7H_{15}COOCOC_7H_{15}$, $C_8H_{17}COOCOC_8H_{17}$, $C_9H_{19}COOCOC_9H_{19}$, $C_{10}H_{21}COOCOC_{10}H_{21}$, $C_{11}H_{23}COOCOC_{11}H_{23}$, $C_{12}H_{25}COOCOC_{12}H_{25}$, $C_{13}H_{27}COOCOC_{13}H_{27}$, $C_{14}H_{29}COOCOC_{14}H_{29}$, $C_{15}H_{31}COOCOC_{15}H_{31}$, $C_{16}H_{33}COOCOC_{16}H_{33}$, $C_{17}H_{35}COOCOC_{17}H_{35}$, $C_{18}H_{37}COOCOC_{18}H_{37}$, $C_6H_5COOCOC_6H_5$, $CF_3COOCOCF_3$, $C_2F_5COOCOC_2F_5$, $C_3F_7COOCOC_3F_7$, $C_4F_9COOCOC_4F_9$, $C_5F_{11}COOCOC_5F_{11}$, $C_6F_{13}COOCOC_6F_{13}$, $C_7F_{15}COOCOC_7F_{15}$, $C_8F_{17}COOCOC_8F_{17}$ and the like.

Furthermore, the water-insoluble surfactant preferably has a hydrophobic moiety formed of a monovalent organic group having hydrocarbon group whose carbon number is 1 to 18 or a monovalent organic group having a fluoroalkyl chain whose carbon number is 1 to 8. The hydrocarbon group may have a straight chain or a branched chain.

Examples of the water-insoluble surfactant of the present invention are compounds as represented by the general formula [1], such as $CH_3COF$, $C_2H_5COF$, $C_3H_7COF$, $C_4H_9COF$, $C_5H_{11}COF$, $C_6H_{13}COF$, $C_7H_{15}COF$, $C_8H_{17}COF$, $C_9H_{19}COF$, $C_{10}H_{21}COF$, $C_{11}H_{23}COF$, $C_{12}H_{25}COF$, $C_{13}H_{27}COF$, $C_{14}H_{29}COF$, $C_{15}H_{31}COF$, $C_{16}H_{33}COF$, $C_{17}H_{35}COF$, $C_{18}H_{37}COF$, $C_6H_5COF$, $CF_3COF$, $C_2F_5COF$, $C_3F_7COF$, $C_4F_9COF$, $C_5F_{11}COF$, $C_6F_{13}COF$, $C_7F_{15}COF$, $C_8F_{17}COF$, $CH_3COCl$, $C_2H_5COCl$, $C_3H_7COCl$, $C_4H_9COCl$, $C_5H_{11}COCl$, $C_6H_{13}COCl$, $C_7H_{15}COCl$, $C_8H_{17}COCl$, $C_9H_{19}COCl$, $C_{10}H_{21}COCl$, $C_{11}H_{23}COCl$, $C_{12}H_{25}COCl$, $C_{13}H_{27}COCl$, $C_{14}H_{29}COCl$, $C_{15}H_{31}COCl$, $C_{16}H_{33}COCl$, $C_{17}H_{35}COCl$, $C_{18}H_{37}COCl$, $C_6H_5COCl$, $CF_3COCl$, $C_2F_5COCl$, $C_3F_7COCl$, $C_4F_9COCl$, $C_5F_{11}COCl$, $C_6F_{13}COCl$, $C_7F_{15}COCl$, $C_8F_{17}COCl$, $CH_3COBr$, $C_2H_5COBr$, $C_3H_7COBr$, $C_4H_9COBr$, $C_5H_{11}COBr$, $C_6H_{13}COBr$, $C_7H_{15}COBr$, $C_8H_{17}COBr$, $C_9H_{19}COBr$, $C_{10}H_{21}COBr$, $C_{11}H_{23}COBr$, $C_{12}H_{25}COBr$, $C_{13}H_{27}COBr$, $C_{14}H_{29}COBr$, $C_{15}H_{31}COBr$, $C_{16}H_{33}COBr$, $C_{17}H_{35}COBr$, $C_{18}H_{37}COBr$, $C_6H_5COBr$, $CF_3COBr$, $C_2F_5COBr$, $C_3F_7COBr$, $C_4F_9COBr$, $C_5F_{11}COBr$, $C_6F_{13}COBr$, $C_7F_{15}COBr$, $C_8F_{17}COBr$, $CH_3COI$, $C_2H_5COI$, $C_3H_7COI$, $C_4H_9COI$, $C_5H_{11}COI$, $C_6H_{13}COI$, $C_7H_{15}COI$, $C_8H_{17}COI$, $C_9H_{19}COI$, $C_{10}H_{21}COI$, $C_{11}H_{23}COI$, $C_{12}H_{25}COI$, $C_{13}H_{27}COI$, $C_{14}H_{29}COI$, $C_{15}H_{31}COI$, $C_{16}H_{33}COI$, $C_{17}H_{35}COI$, $C_{18}H_{37}COI$, $C_6H_5COI$, $CF_3COI$, $C_2F_5COI$, $C_3F_7COI$, $C_4F_9COI$, $C_5F_{11}COI$, $C_6F_{13}COI$, $C_7F_{15}COI$, $C_8F_{17}COI$ and the like.

Additionally, examples thereof further include: compounds as represented by the general formula [2], such as $C_5H_{11}NH_2$, $C_6H_{13}NH_2$, $C_7H_{15}NH_2$, $C_8H_{17}NH_2$, $C_9H_{19}NH_2$, $C_{10}H_{21}NH_2$, $C_{11}H_{23}NH_2$, $C_{12}H_{25}NH_2$, $C_{13}H_{27}NH_2$, $C_{14}H_{29}NH_2$, $C_{15}H_{31}NH_2$, $C_{16}H_{33}NH_2$, $C_{17}H_{35}NH_2$, $C_{18}H_{37}NH_2$, $CF_3NH_2$, $C_2F_5NH_2$, $C_3F_7NH_2$, $C_4F_9NH_2$, $C_5F_{11}NH_2$, $C_6F_{13}NH_2$, $C_7F_{15}NH_2$, $C_8F_{17}NH_2$, $C_4Cl_9NH_2$, $C_5Cl_{11}NH_2$, $C_6Cl_{13}NH_2$, $C_7Cl_{15}NH_2$, $C_8Cl_{17}NH_2$, $C_4Br_9NH_2$, $C_5Br_{11}NH_2$, $C_6Br_{13}NH_2$, $C_7Br_{15}NH_2$, $C_8Br_{17}NH_2$, $C_4I_9NH_2$, $C_5I_{11}NH_2$, $C_6I_{13}NH_2$, $C_7I_{15}NH_2$, $C_8I_{17}NH_2$, $C_4F_7H_2NH_2$, $C_6F_{11}H_2NH_2$, $C_8F_{15}H_2NH_2$, $C_4Cl_7H_2NH_2$, $C_6Cl_{11}H_2NH_2$, $C_8Cl_{15}H_2NH_2$, $C_4Br_7H_2NH_2$, $C_6Br_{11}H_2NH_2$, $C_8Br_{15}H_2NH_2$, $C_4I_7H_2NH_2$, $C_6I_{11}H_2NH_2$, $C_8I_{15}H_2NH_2$, $C_4F_7Cl_2NH_2$, $C_4F_7Br_2NH_2$, $C_4F_7I_2NH_2$, $(C_3H_7)_2NH$, $(C_4H_9)_2NH$, $(C_5H_{11})_2NH$, $(C_6H_{13})_2NH$, $(C_7H_{15})_2NH$, $(C_8H_{17})_2NH$, $(C_9H_{19})_2NH$, $(C_{10}H_{21})_2NH$, $(C_{11}H_{23})_2NH$, $(C_{12}H_{25})_2NH$, $(C_{13}H_{27})_2NH$, $(C_{14}H_{29})_2NH$, $(C_{15}H_{31})_2NH$, $(C_{16}H_{33})_2NH$, $(C_{17}H_{35})_2NH$, $(C_{18}H_{37})_2NH$, $(CF_3)_2NH$, $(C_2F_5)_2NH$, $(C_3F_7)_2NH$, $(C_4F_9)_2NH$, $(C_5F_{11})_2NH$, $(C_6F_{13})_2NH$, $(C_7F_{15})_2NH$, $(C_8F_{17})_2NH$, $(C_4Cl_9)_2NH$, $(C_5Cl_{11})_2NH$, $(C_6Cl_{13})_2NH$, $(C_7Cl_{15})_2NH$, $(C_8Cl_{17})_2NH$, $(C_4Br_9)_2NH$, $(C_5Br_{11})_2NH$, $(C_6Br_{13})_2NH$, $(C_7Br_{15})_2NH$, $(C_8Br_{17})_2NH$, $(C_4I_9)_2NH$, $(C_5I_{11})_2NH$, $(C_6I_{13})_2NH$, $(C_7I_{15})_2NH$, $(C_8I_{17})_2NH$, $(C_4F_7H_2)_2NH$, $(C_6F_{11}H_2)_2NH$, $(C_8F_{15}H_2)_2NH$, $(C_4Cl_7H_2)_2NH$, $(C_6Cl_{11}H_2)_2NH$, $(C_8Cl_{15}H_2)_2NH$, $(C_4Br_7H_2)_2NH$, $(C_6Br_{11}H_2)_2NH$, $(C_8Br_{15}H_2)_2NH$, $(C_4I_7H_2)_2NH$, $(C_6I_{11}H_2)_2NH$, $(C_8I_{15}H_2)_2NH$, $(C_4F_7Cl_2)_2NH$, $(C_4F_7Br_2)_2NH$, $(C_4F_7I_2)_2NH$, $(C_2H_5)_3N$, $(C_3H_7)_3N$, $(C_4H_9)_3N$, $(C_5H_{11})_3N$, $(C_6H_{13})_3N$, $(C_7H_{15})_3N$, $(C_8H_{17})_3N$, $(C_9H_{19})_3N$, $(C_{10}H_{21})_3N$, $(C_{11}H_{23})_3N$, $(C_{12}H_{25})_3N$, $(C_{13}H_{27})_3N$, $(C_{14}H_{29})_3N$, $(C_{15}H_{31})_3N$, $(C_{16}H_{33})_3N$, $(C_{17}H_{35})_3N$, $(C_{18}H_{37})_3N$, $(CF_3)_3N$, $(C_2F_5)_3N$, $(C_3F_7)_3N$, $(C_4F_9)_3N$, $(C_5F_{11})_3N$, $(C_6F_{13})_3N$, $(C_7F_{15})_3N$, $(C_8F_{17})_3N$, $(C_4Cl_9)_3N$, $(C_5Cl_{11})_3N$, $(C_6Cl_{13})_3N$, $(C_7Cl_{15})_3N$, $(C_8Cl_{17})_3N$, $(C_4Br_9)_3N$, $(C_5Br_{11})_3N$, $(C_6Br_{13})_3N$, $(C_7Br_{15})_3N$, $(C_8Br_{17})_3N$, $(C_4I_9)_3N$, $(C_5I_{11})_3N$, $(C_6I_{13})_3N$, $(C_7I_{15})_3N$, $(C_8I_{17})_3N$, $(C_4F_7H_2)_3N$, $(C_6F_{11}H_2)_3N$, $(C_8F_{15}H_2)_3N$, $(C_4Cl_7H_2)_3N$, $(C_6Cl_{11}H_2)_3N$, $(C_8Cl_{15}H_2)_3N$, $(C_4Br_7H_2)_3N$, $(C_6Br_{11}H_2)_3N$, $(C_8Br_{15}H_2)_3N$, $(C_4I_7H_2)_3N$, $(C_6I_{11}H_2)_3N$, $(C_8I_{15}H_2)_3N$, $(C_4F_7Cl_2)_3N$, $(C_4F_7Br_2)_3N$, $(C_4F_7I_2)_3N$, $(C_5H_{11})(CH_3)NH$, $(C_6H_{13})(CH_3)NH$, $(C_7H_{15})(CH_3)NH$, $(C_8H_{17})(CH_3)NH$, $(C_9H_{19})(CH_3)NH$, $(C_{10}H_{21})(CH_3)NH$, $(C_{11}H_{23})(CH_3)NH$, $(C_{12}H_{25})(CH_3)NH$, $(C_{13}H_{27})(CH_3)NH$, $(C_{14}H_{29})(CH_3)NH$, $(C_{15}H_{31})(CH_3)NH$, $(C_{16}H_{33})(CH_3)NH$, $(C_{17}H_{35})(CH_3)NH$, $(C_{18}H_{37})(CH_3)NH$, $(CF_3)(CH_3)NH$, $(C_2F_5)(CH_3)NH$, $(C_3F_7)(CH_3)NH$, $(C_4F_9)(CH_3)NH$, $(C_5F_{11})(CH_3)NH$, $(C_6F_{13})(CH_3)NH$, $(C_7F_{15})(CH_3)NH$, $(C_8F_{17})(CH_3)NH$, $(C_3H_7)(CH_3)_2N$, $(C_4H_9)(CH_3)_2N$, $(C_5H_{11})(CH_3)_2N$, $(C_6H_{13})(CH_3)_2N$, $(C_7H_{15})(CH_3)_2N$, $(C_8H_{17})(CH_3)_2N$, $(C_9H_{19})(CH_3)_2N$, $(C_{10}H_{21})(CH_3)_2N$, $(C_{11}H_{23})(CH_3)_2N$, $(C_{12}H_{25})(CH_3)_2N$, $(C_{13}H_{27})(CH_3)_2N$, $(C_{14}H_{29})(CH_3)_2N$, $(C_{15}H_{31})(CH_3)_2N$, $(C_{16}H_{33})(CH_3)_2N$, $(C_{17}H_{35})(CH_3)_2N$, $(C_{18}H_{37})(CH_3)_2N$, $(CF_3)(CH_3)_2N$, $(C_2F_5)(CH_3)_2N$, $(C_3F_7)(CH_3)_2N$, $(C_4F_9)(CH_3)_2N$, $(C_5F_{11})(CH_3)_2N$, $(C_6F_{13})(CH_3)_2N$, $(C_7F_{15})(CH_3)_2N$, $(C_8F_{17})(CH_3)_2N$ and the like; their inorganic acid salts such as carbonates, hydrochlorides, sulfates, nitrates and the like; and their organic acid salts such as acetates, propionates, butyrates, phthalates and the like.

Additionally, examples thereof further include compounds as represented by the general formula [3], such as $C_5H_{11}COOH$, $C_6H_{13}COOH$, $C_7H_{15}COOH$, $C_8H_{17}COOH$, $C_9H_{19}COOH$, $C_{10}H_{21}COOH$, $C_{11}H_{23}COOH$, $C_{12}H_{25}COOH$, $C_{13}H_{27}COOH$, $C_{14}H_{29}COOH$, $C_{15}H_{31}COOH$, $C_{16}H_{33}COOH$, $C_{17}H_{35}COOH$, $C_{18}H_{37}COOH$, $C_6H_5COOH$, $C_5F_{11}COOH$, $C_6F_{13}COOH$, $C_7F_{15}COOH$, $C_8F_{17}COOH$, $CH_3COOCH_3$, $C_2H_5COOCH_3$, $C_3H_7COOCH_3$, $C_4H_9COOCH_3$, $C_5H_{11}COOCH_3$, $C_6H_{13}COOCH_3$, $C_7H_{15}COOCH_3$, $C_8H_{17}COOCH_3$, $C_9H_{19}COOCH_3$, $C_{10}H_{21}COOCH_3$, $C_{11}H_{23}COOCH_3$, $C_{12}H_{25}COOCH_3$, $C_{13}H_{27}COOCH_3$, $C_{14}H_{29}COOCH_3$, $C_{15}H_{31}COOCH_3$, $C_{16}H_{33}COOCH_3$, $C_{17}H_{35}COOCH_3$, $C_{18}H_{37}COOCH_3$, $C_6H_5COOCH_3$, $CF_3COOCH_3$, $C_2F_5COOCH_3$, $C_3F_7COOCH_3$, $C_4F_9COOCH_3$, $C_5F_{11}COOCH_3$, $C_6F_{13}COOCH_3$, $C_7F_{15}COOCH_3$, $C_8F_{17}COOCH_3$, $CH_3COOC_2H_5$, $C_2H_5COOC_2H_5$, $C_3H_7COOC_2H_5$, $C_4H_9COOC_2H_5$, $C_5H_{11}COOC_2H_5$, $C_6H_{13}COOC_2H_5$, $C_7H_{15}COOC_2H_5$, $C_8H_{17}COOC_2H_5$, $C_9H_{19}COOC_2H_5$, $C_{10}H_{21}COOC_2H_5$, $C_{11}H_{23}COOC_2H_5$, $C_{12}H_{25}COOC_2H_5$, $C_{13}H_{27}COOC_2H_5$, $C_{14}H_{29}COOC_2H_5$, $C_{15}H_{31}COOC_2H_5$, $C_{16}H_{33}COOC_2H_5$, $C_{17}H_{35}COOC_2H_5$, $C_{18}H_{37}COOC_2H_5$, $C_6H_5COOC_2H_5$, $CF_3COOC_2H_5$, $C_2F_5COOC_2H_5$, $C_3F_7COOC_2H_5$, $C_4F_9COOC_2H_5$, $C_5F_{11}COOC_2H_5$, $C_6F_{13}COOC_2H_5$, $C_7F_{15}COOC_2H_5$, $C_8F_{17}COOC_2H_5$, $CH_3COOC_6H_5$, $C_2H_5COOC_6H_5$, $C_3H_7COOC_6H_5$, $C_4H_9COOC_6H_5$, $C_5H_{11}COOC_6H_5$, $C_6H_{13}COOC_6H_5$, $C_7H_{15}COOC_6H_5$, $C_8H_{17}COOC_6H_5$, $C_9H_{19}COOC_6H_5$, $C_{10}H_{21}COOC_6H_5$, $C_{11}H_{23}COOC_6H_5$, $C_{12}H_{25}COOC_6H_5$, $C_{13}H_{27}COOC_6H_5$, $C_{14}H_{29}COOC_6H_5$, $C_{15}H_{31}COOC_6H_5$, $C_{16}H_{33}COOC_6H_5$, $C_{17}H_{35}COOC_6H_5$, $C_{18}H_{37}COOC_6H_5$, $C_6H_5COOC_6H_5$, $CF_3COOC_6H_5$, $C_2F_5COOC_6H_5$, $C_3F_7COOC_6H_5$, $C_4F_9COOC_6H_5$, $C_5F_{11}COOC_6H_5$, $C_6F_{13}COOC_6H_5$, $C_7F_{15}COOC_6H_5$, $C_8F_{17}COOC_6H_5$, $C_4H_9COSH$, $C_5H_{11}COSH$, $C_6H_{13}COSH$, $C_7H_{15}COSH$, $C_8H_{17}COSH$, $C_9H_{19}COSH$, $C_{10}H_{21}COSH$, $C_{11}H_{23}COSH$, $C_{12}H_{25}COSH$, $C_{13}H_{27}COSH$, $C_{14}H_{29}COSH$, $C_{15}H_{31}COSH$, $C_{16}H_{33}COSH$, $C_{17}H_{35}COSH$, $C_{18}H_{37}COSH$, $C_6H_5COSH$, $C_4F_9COSH$, $C_5F_{11}COSH$, $C_6F_{13}COSH$, $C_7F_{15}COSH$, $C_8F_{17}COSH$, $CH_3COSCH_3$, $C_2H_5COSCH_3$, $C_3H_7COSCH_3$, $C_4H_9COSCH_3$, $C_5H_{11}COSCH_3$, $C_6H_{13}COSCH_3$, $C_7H_{15}COSCH_3$, $C_8H_{17}COSCH_3$, $C_9H_{19}COSCH_3$, $C_{10}H_{21}COSCH_3$, $C_{11}H_{23}COSCH_3$, $C_{12}H_{25}COSCH_3$, $C_{13}H_{27}COSCH_3$, $C_{14}H_{29}COSCH_3$, $C_{15}H_{31}COSCH_3$, $C_{16}H_{33}COSCH_3$, $C_{17}H_{35}COSCH_3$, $C_{18}H_{37}COSCH_3$, $C_6H_5COSCH_3$, $CF_3COSCH_3$, $C_2F_5COSCH_3$, $C_3F_7COSCH_3$, $C_4F_9COSCH_3$, $C_5F_{11}COSCH_3$, $C_6F_{13}COSCH_3$, $C_7F_{15}COSCH_3$, $C_8F_{17}COSCH_3$ and the like.

Additionally, examples thereof further include compounds as represented by the general formula [4], such as $C_2H_5NCO$, $C_3H_7NCO$, $C_4H_9NCO$, $C_5H_{11}NCO$, $C_6H_{13}NCO$, $C_7H_{15}NCO$, $C_8H_{17}NCO$, $C_9H_{19}NCO$, $C_{10}H_{21}NCO$, $C_{11}H_{23}NCO$, $C_{12}H_{25}NCO$, $C_{13}H_{27}NCO$, $C_{14}H_{29}NCO$, $C_{15}H_{31}NCO$, $C_{16}H_{33}NCO$, $C_{17}H_{35}NCO$, $C_{18}H_{37}NCO$, $CF_3NCO$, $C_2F_5NCO$, $C_3F_7NCO$, $C_4F_9NCO$, $C_5F_{11}NCO$, $C_6F_{13}NCO$, $C_7F_{15}NCO$, $C_8F_{17}NCO$, $CH_2(NCO)_2$, $C_2H_4(NCO)_2$, $C_3H_6(NCO)_2$, $C_4H_8(NCO)_2$, $C_5H_{10}(NCO)_2$, $C_6H_{12}(NCO)_2$, $C_7H_{14}(NCO)_2$, $C_8H_{16}(NCO)_2$, $C_9H_{18}(NCO)_2$, $C_{10}H_{20}(NCO)_2$, $C_{11}H_{22}(NCO)_2$, $C_{12}H_{24}(NCO)_2$, $C_{13}H_{26}(NCO)_2$, $C_{14}H_{28}(NCO)_2$, $C_{15}H_{30}(NCO)_2$, $C_{16}H_{32}(NCO)_2$, $C_{17}H_{34}(NCO)_2$, $C_{18}H_{36}(NCO)_2$, $(NCO)C_2H_4NCO$, $(NCO)C_3H_6NCO$, $(NCO)C_4H_8NCO$, $(NCO)C_5H_{10}NCO$, $(NCO)C_6H_{12}NCO$, $(NCO)C_7H_{14}NCO$, $(NCO)C_8H_{16}NCO$, $(NCO)C_9H_{18}NCO$, $(NCO)C_{10}H_{20}NCO$, $(NCO)C_{11}H_{22}NCO$, $(NCO)C_{12}H_{24}NCO$, $(NCO)C_{13}H_{26}NCO$, $(NCO)C_{14}H_{28}NCO$, $(NCO)C_{15}H_{30}NCO$, $(NCO)C_{16}H_{32}NCO$, $(NCO)C_{17}H_{34}NCO$, $(NCO)C_{18}H_{36}NCO$, $CH(NCO)_3$, $C_2H_3(NCO)_3$, $C_3H_5(NCO)_3$, $C_4H_7(NCO)_3$, $C_5H_9(NCO)_3$, $C_6H_{11}(NCO)_3$, $C_7H_{13}(NCO)_3$, $C_8H_{15}(NCO)_3$, $C_9H_{17}(NCO)_3$, $C_{10}H_{19}(NCO)_3$, $C_{11}H_{21}(NCO)_3$, $C_{12}H_{23}(NCO)_3$, $C_{13}H_{25}(NCO)_3$, $C_{14}H_{27}(NCO)_3$, $C_{15}H_{29}(NCO)_3$, $C_{16}H_{31}(NCO)_3$, $C_{17}H_{33}(NCO)_3$, $C_{18}H_{35}(NCO)_3$, $C(NCO)_4$, $(NCO)_2C_2H_2(NCO)_2$, $(NCO)_2C_3H_4(NCO)_2$, $(NCO)_2C_4H_6(NCO)_2$, $(NCO)_2C_5H_8(NCO)_2$, $(NCO)_2C_6H_{10}(NCO)_2$, $(NCO)_2C_7H_{12}(NCO)_2$, $(NCO)_2C_8H_{14}(NCO)_2$, $(NCO)_2C_9H_{16}(NCO)_2$, $(NCO)_2C_{10}H_{18}(NCO)_2$, $(NCO)_2C_{11}H_{20}(NCO)_2$, $(NCO)_2C_{12}H_{22}(NCO)_2$, $(NCO)_2C_{13}H_{24}(NCO)_2$, $(NCO)_2C_{14}H_{26}(NCO)_2$, $(NCO)_2C_{15}H_{28}(NCO)_2$, $(NCO)_2C_{16}H_{30}(NCO)_2$, $(NCO)_2C_{17}H_{32}(NCO)_2$, $(NCO)_2C_{18}H_{34}(NCO)_2$, $C_2H_5SH$, $C_3H_7SH$, $C_4H_9SH$, $C_5H_{11}SH$, $C_6H_{13}SH$, $C_7H_{15}SH$, $C_8H_{17}SH$, $C_9H_{19}SH$, $C_{10}H_{21}SH$, $C_{11}H_{23}SH$, $C_{12}H_{25}SH$, $C_{13}H_{27}SH$, $C_{14}H_{29}SH$, $C_{15}H_{31}SH$, $C_{16}H_{33}SH$, $C_{17}H_{35}SH$, $C_{18}H_{37}SH$, $CF_3SH$, $C_2F_5SH$, $C_3F_7SH$, $C_4F_9SH$, $C_5F_{11}SH$, $C_6F_{13}SH$, $C_7F_{15}SH$, $C_8F_{17}SH$, $C_4H_8(SH)_2$, $C_5H_{10}(SH)_2$, $C_6H_{12}(SH)_2$, $C_7H_{14}(SH)_2$, $C_8H_{16}(SH)_2$, $C_9H_{18}(SH)_2$, $C_{10}H_{20}(SH)_2$, $C_{11}H_{22}(SH)_2$, $C_{12}H_{24}(SH)_2$, $C_{13}H_{26}(SH)_2$, $C_{14}H_{28}(SH)_2$, $C_{15}H_{30}(SH)_2$, $C_{16}H_{32}(SH)_2$, $C_{17}H_{34}(SH)_2$, $C_{18}H_{36}(SH)_2$, $(SH)C_4H_8SH$, $(SH)C_5H_{10}SH$, $(SH)C_6H_{12}SH$, $(SH)C_7H_{14}SH$, $(SH)C_8H_{16}SH$, $(SH)C_9H_{18}SH$, $(SH)C_{10}H_{20}SH$, $(SH)C_{11}H_{22}SH$, $(SH)C_{12}H_{24}SH$, $(SH)C_{13}H_{26}SH$, $(SH)C_{14}H_{28}SH$, $(SH)C_{15}H_{30}SH$, $(SH)C_{16}H_{32}SH$, $(SH)C_{17}H_{34}SH$, $(SH)C_{18}H_{36}SH$, $C_4H_7(SH)_3$, $C_5H_9(SH)_3$, $C_6H_{11}(SH)_3$, $C_7H_{13}(SH)_3$, $C_8H_{15}(SH)_3$, $C_9H_{17}(SH)_3$, $C_{10}H_{19}(SH)_3$, $C_{11}H_{21}(SH)_3$, $C_{12}H_{23}(SH)_3$, $C_{13}H_{25}(SH)_3$, $C_{14}H_{27}(SH)_3$, $C_{15}H_{29}(SH)_3$, $C_{16}H_{31}(SH)_3$, $C_{17}H_{33}(SH)_3$, $C_{18}H_{35}(SH)_3$, $(SH)_2C_4H_6(SH)_2$, $(SH)_2C_5H_8(SH)_2$, $(SH)_2C_6H_{10}(SH)_2$, $(SH)_2C_7H_{12}(SH)_2$, $(SH)_2C_8H_{14}(SH)_2$, $(SH)_2C_9H_{16}(SH)_2$, $(SH)_2C_{10}H_{18}(SH)_2$, $(SH)_2C_{11}H_{20}(SH)_2$, $(SH)_2C_{12}H_{22}(SH)_2$, $(SH)_2C_{13}H_{24}(SH)_2$, $(SH)_2C_{14}H_{26}(SH)_2$, $(SH)_2C_{15}H_{28}(SH)_2$, $(SH)_2C_{16}H_{30}(SH)_2$, $(SH)_2C_{17}H_{32}(SH)_2$, $(SH)_2C_{18}H_{34}(SH)_2$, $CH_3CHO$, $C_2H_5CHO$, $C_3H_7CHO$, $C_4H_9CHO$, $C_5H_{11}CHO$, $C_6H_{13}CHO$, $C_7H_{15}CHO$, $C_8H_{17}CHO$, $C_9H_{19}CHO$, $C_{10}H_{21}CHO$, $C_{11}H_{23}CHO$, $C_{12}H_{25}CHO$, $C_{13}H_{27}CHO$, $C_{14}H_{29}CHO$, $C_{15}H_{31}CHO$, $C_{16}H_{33}CHO$, $C_{17}H_{35}CHO$, $C_{18}H_{37}CHO$, $C_6H_5CHO$, $CF_3CHO$, $C_2F_5CHO$, $C_3F_7CHO$, $C_4F_9CHO$, $C_5F_{11}CHO$, $C_6F_{13}CHO$, $C_7F_{15}CHO$, $C_8F_{17}CHO$ and the like.

Additionally, examples thereof further include compounds as represented by the general formula [5], such as $C_4H_4S$, $CH_3C_4H_3S$, $C_2H_5C_4H_3S$, $C_3H_7C_4H_3S$, $C_4H_9C_4H_3S$, $C_5H_{11}C_4H_3S$, $C_6H_{13}C_4H_3S$, $C_7H_{15}C_4H_3S$, $C_8H_{17}C_4H_3S$, $C_9H_{19}C_4H_3S$, $C_{10}H_{21}C_4H_3S$, $C_{11}H_{23}C_4H_3S$, $C_{12}H_{25}C_4H_3S$, $C_{13}H_{27}C_4H_3S$, $C_{14}H_{29}C_4H_3S$, $C_{15}H_{31}C_4H_3S$, $C_{16}H_{33}C_4H_3S$, $C_{17}H_{35}C_4H_3S$, $C_{18}H_{37}C_4H_3S$ and the like. Incidentally, $C_4H_4S$ means thiophene. $C_4H_3S$ means a thiophene ring.

Additionally, examples thereof further include compounds as represented by the general formula [6], such as $CH_3COOCOCH_3$, $C_2H_5COOCOC_2H_5$, $C_3H_7COOCOC_3H_7$, $C_4H_9COOCOC_4H_9$, $C_5H_{11}COOCOC_5H_{11}$, $C_6H_{13}COOCOC_6H_{13}$, $C_7H_{15}COOCOC_7H_{15}$, $C_8H_{17}COOCOC_8H_{17}$, $C_9H_{19}COOCOC_9H_{19}$, $C_{10}H_{21}COOCOC_{10}H_{21}$, $C_{11}H_{23}COOCOC_{11}H_{23}$, $C_{12}H_{25}COOCOC_{12}H_{25}$, $C_{13}H_{27}COOCOC_{13}H_{27}$, $C_{14}H_{29}COOCOC_{14}H_{29}$, $C_{15}H_{31}COOCOC_{15}H_{31}$, $C_{16}H_{33}COOCOC_{16}H_{33}$, $C_{17}H_{35}COOCOC_{17}H_{35}$, $C_{18}H_{31}COOCOC_{18}H_{37}$, $C_6H_5COOCOC_6H_5$, $CF_3COOCOCF_3$, $C_2F_5COOCOC_2F_5$, $C_3F_7COOCOC_3F_7$, $C_4F_9COOCOC_4F_9$, $C_5F_{11}COOCOC_5F_{11}$, $C_6F_{13}COOCOC_6F_{13}$, $C_7F_{15}COOCOC_7F_{15}$, $C_8F_{17}COOCOC_8F_{17}$ and the like.

In a case where the water-insoluble surfactant forms a salt, the liquid chemical for forming the protecting film may contain the surfactant, a salt thereof, or a mixture of these.

Additionally, in order to allow imparting a more excellent water repellency, it is preferable that the water-insoluble surfactant is at least one kind selected from the group consisting of; a compound in which $R^1$ is a monovalent organic group having hydrocarbon group whose carbon number is 8 to 18 in the water-insoluble surfactant represented by the general formula [1]; a compound in which $R^2$ is a monovalent organic group having hydrocarbon group whose carbon number is 6 to 18, $R^3$ is a hydrogen atom or a monovalent organic group having hydrocarbon group whose carbon number is 1 to 18, and $R^4$ is a hydrogen atom or a monovalent organic group having hydrocarbon group whose carbon number is 1 to 18, in the water-insoluble surfactant represented by the general formula [2]; and a salt compound thereof.

Additionally, in order to allow imparting a more excellent water repellency, it is preferable that the water-insoluble surfactant is at least one kind selected from the group consisting of; a compound in which $R^5$ is a monovalent organic group having hydrocarbon group whose carbon number is 6 to 18, V is an oxygen atom and W is a hydrogen atom in the water-insoluble surfactant represented by the general formula [3]; and a compound in which a is 1 and $R^6$ is a monovalent organic group having hydrocarbon group whose carbon number is 6 to 18.

Additionally, the water-insoluble surfactant preferably has hydrophobic moieties including a straight-chain hydrocarbon group formed of a carbon atom and a hydrogen atom. Since the straight-chain hydrocarbon group included in the hydrophobic moieties is formed of a carbon atom and a hydrogen atom, the hydrophobic moieties in the surfactant become readily disposed toward the direction perpendicular to the surface of the protecting film when the protecting film is formed, thereby enhancing the water repellency-providing effect.

If considering the affinity with the metal-based matter and the water repellency-providing effect, the particularly preferable examples among the above-mentioned water-insoluble surfactants are compounds as represented by the general formula [1], such as $C_8H_{17}COF$, $C_9H_{19}COF$, $C_{10}H_{21}COF$, $C_{11}H_{23}COF$, $C_{12}H_{25}COF$, $C_{13}H_{27}COF$, $C_{14}H_{29}COF$, $C_{15}H_{31}COF$, $C_{16}H_{33}COF$, $C_{17}H_{35}COF$, $C_{18}H_{37}COF$, $C_8H_{17}COCl$, $C_9H_{19}COCl$, $C_{10}H_{21}COCl$, $C_{11}H_{23}COCl$, $C_{12}H_{25}COCl$, $C_{13}H_{27}COCl$, $C_{14}H_{29}COCl$, $C_{15}H_{31}COCl$, $C_{16}H_{33}COCl$, $C_{17}H_{35}COCl$, $C_{18}H_{37}COCl$, $C_8H_{17}COBr$, $C_9H_{19}COBr$, $C_{10}H_{21}COBr$, $C_{11}H_{23}COBr$, $C_{12}H_{25}COBr$, $C_{13}H_{27}COBr$, $C_{14}H_{29}COBr$, $C_{15}H_{31}COBr$, $C_{16}H_{33}COBr$, $C_{17}H_{35}COBr$, $C_{18}H_{37}COBr$, $C_{11}H_{23}COI$, $C_{12}H_{25}COI$, $C_{13}H_{27}COI$, $C_{14}H_{29}COI$, $C_{15}H_{31}COI$, $C_{16}H_{33}COI$, $C_{17}H_{35}COI$, $C_{18}H_{37}COI$ and the like. The use of the above compounds is preferable, because a water repellency-provided condition is readily imparted to the surface of the recessed portion in a shorter time and a water repellency-keeping effect in the subsequent cleaning step is excellently exhibited.

Additionally, examples thereof include; compounds as represented by the general formula [2], such as $C_6H_{13}NH_2$, $C_7H_{15}NH_2$, $C_8H_{17}NH_2$, $C_9H_{19}NH_2$, $C_{10}H_{21}NH_2$, $C_{11}H_{23}NH_2$, $C_{12}H_{25}NH_2$, $C_{13}H_{27}NH_2$, $C_{14}H_{29}NH_2$, $C_{15}H_{31}NH_2$, $C_{16}H_{33}NH_2$, $C_{17}H_{35}NH_2$, $C_{18}H_{37}NH_2$, $(C_4H_9)_2NH$, $(C_5H_{11})_2NH$, $(C_6H_{13})_2NH$, $(C_7H_{15})_2NH$, $(C_8H_{17})_2NH$, $(C_9H_{19})_2NH$, $(C_{10}H_{21})_2NH$, $(C_{11}H_{23})_2NH$, $(C_{12}H_{25})_2NH$, $(C_{13}H_{27})_2NH$, $(C_{14}H_{29})_2NH$, $(C_{15}H_{31})_2NH$, $(C_{16}H_{33})_2NH$, $(C_{17}H_{35})_2NH$, $(C_{18}H_{37})_2NH$, $(C_4H_9)_3N$, $(C_5H_{11})_3N$, $(C_6H_{13})_3N$, $(C_7H_{15})_3N$, $(C_8H_{17})_3N$, $(C_9H_{19})_3N$, $(C_{10}H_{21})_3N$, $(C_{11}H_{23})_3N$, $(C_{12}H_{25})_3N$, $(C_{13}H_{27})_3N$, $(C_{14}H_{29})_3N$, $(C_{15}H_{31})_3N$, $(C_{16}H_{33})_3N$, $(C_{17}H_{35})_3N$, $(C_{18}H_{37})_3N$, $(C_5H_{11})(CH_3)NH$, $(C_6H_{13})(CH_3)NH$, $(C_7H_{15})(CH_3)NH$, $(C_8H_{17})(CH_3)NH$, $(C_9H_{19})(CH_3)NH$, $(C_{10}H_{21})(CH_3)NH$, $(C_{11}H_{23})(CH_3)NH$, $(C_{12}H_{25})(CH_3)NH$, $(C_{13}H_{27})(CH_3)NH$, $(C_{14}H_{29})(CH_3)NH$, $(C_{15}H_{31})(CH_3)NH$, $(C_{16}H_{33})(CH_3)NH$, $(C_{17}H_{35})(CH_3)NH$, $(C_{18}H_{37})(CH_3)NH$, $(C_4H_9)(CH_3)_2N$, $(C_5H_{11})(CH_3)_2N$, $(C_6H_{13})(CH_3)_2N$, $(C_7H_{15})(CH_3)_2N$, $(C_8H_{17})(CH_3)_2N$, $(C_9H_{19})(CH_3)_2N$, $(C_{10}H_{21})(CH_3)_2N$, $(C_{11}H_{23})(CH_3)_2N$, $(C_{12}H_{25})(CH_3)_2N$, $(C_{13}H_{27})(CH_3)_2N$, $(C_{14}H_{29})(CH_3)_2N$, $(C_{15}H_{31})(CH_3)_2N$, $(C_{16}H_{33})(CH_3)_2N$, $(C_{17}H_{35})(CH_3)_2N$, $(C_{18}H_{37})(CH_3)_2N$ and the like; their inorganic acid salts such as carbonates, hydrochlorides, sulfates, nitrates and the like; and their organic acid salts such as acetates, propionates, butyrates, phthalates and the like. Incidentally, in a case of forming a salt, the surfactant preferably has a HLB value of from 0.001 to 10 before forming the salt.

Additionally, examples thereof further include compounds as represented by the general formula [3], such as $C_5H_{11}COOH$, $C_6H_{13}COOH$, $C_7H_{15}COOH$, $C_8H_{17}COOH$, $C_9H_{19}COOH$, $C_{10}H_{21}COOH$, $C_{11}H_{23}COOH$, $C_{12}H_{25}COOH$, $C_{13}H_{27}COOH$, $C_{14}H_{29}COOH$, $C_{15}H_{31}COOH$, $C_{16}H_{33}COOH$, $C_{17}H_{35}COOH$, $C_{18}H_{37}COOH$, $C_4H_9COOCH_3$, $C_5H_{11}COOCH_3$, $C_6H_{13}COOCH_3$, $C_7H_{15}COOCH_3$, $C_8H_{17}COOCH_3$, $C_9H_{19}COOCH_3$, $C_{10}H_{21}COOCH_3$, $C_{11}H_{23}COOCH_3$, $C_{12}H_{25}COOCH_3$, $C_{13}H_{27}COOCH_3$, $C_{14}H_{29}COOCH_3$, $C_{15}H_{31}COOCH_3$, $C_{16}H_{33}COOCH_3$, $C_{17}H_{35}COOCH_3$, $C_{18}H_{37}COOCH_3$, $C_4H_9COOC_2H_5$, $C_5H_{11}COOC_2H_5$, $C_6H_{13}COOC_2H_5$, $C_7H_{15}COOC_2H_5$, $C_8H_{17}COOC_2H_5$, $C_9H_{19}COOC_2H_5$, $C_{10}H_{21}COOC_2H_5$, $C_{11}H_{23}COOC_2H_5$, $C_{12}H_{25}COOC_2H_5$, $C_{13}H_{27}COOC_2H_5$, $C_{14}H_{29}COOC_2H_5$, $C_{15}H_{31}COOC_2H_5$, $C_{16}H_{33}COOC_2H_5$, $C_{17}H_{35}COOC_2H_5$, $C_{18}H_{37}COOC_2H_5$, $C_4H_9COOC_6H_5$, $C_5H_{11}COOC_6H_5$, $C_6H_{13}COOC_6H_5$, $C_7H_{15}COOC_6H_5$, $C_8H_{17}COOC_6H_5$, $C_9H_{19}COOC_6H_5$, $C_{10}H_{21}COOC_6H_5$, $C_{11}H_{23}COOC_6H_5$, $C_{12}H_{25}COOC_6H_5$, $C_{13}H_{27}COOC_6H_5$, $C_{14}H_{29}COOC_6H_5$, $C_{15}H_{31}COOC_6H_5$, $C_{16}H_{33}COOC_6H_5$, $C_{17}H_{35}COOC_6H_5$, $C_{18}H_{37}COOC_6H_5$, $C_5H_{11}COSH$, $C_6H_{13}COSH$, $C_7H_{15}COSH$, $C_8H_{17}COSH$, $C_9H_{19}COSH$, $C_{10}H_{21}COSH$, $C_{11}H_{23}COSH$, $C_{12}H_{25}COSH$, $C_{13}H_{27}COSH$, $C_{14}H_{29}COSH$, $C_{15}H_{31}COSH$, $C_{16}H_{33}COSH$, $C_{17}H_{35}COSH$, $C_{18}H_{37}COSH$, $C_4H_9COSCH_3$, $C_5H_{11}COSCH_3$, $C_6H_{13}COSCH_3$, $C_7H_{15}COSCH_3$, $C_8H_{17}COSCH_3$, $C_9H_{19}COSCH_3$, $C_{10}H_{21}COSCH_3$, $C_{11}H_{23}COSCH_3$, $C_{12}H_{25}COSCH_3$, $C_{13}H_{27}COSCH_3$, $C_{14}H_{29}COSCH_3$, $C_{15}H_{31}COSCH_3$, $C_{16}H_{33}COSCH_3$, $C_{17}H_{35}COSCH_3$, $C_{18}H_{37}COSCH_3$ and the like.

Additionally, examples thereof further include compounds as represented by the general formula [4], such as $C_4H_9NCO$, $C_5H_{11}NCO$, $C_6H_{13}NCO$, $C_7H_{15}NCO$, $C_8H_{17}NCO$, $C_9H_{19}NCO$, $C_{10}H_{21}NCO$, $C_{11}H_{23}NCO$, $C_{12}H_{25}NCO$, $C_{13}H_{27}NCO$, $C_{14}H_{29}NCO$, $C_{15}H_{31}NCO$, $C_{16}H_{33}NCO$, $C_{17}H_{35}NCO$, $C_{18}H_{37}NCO$, $C_4H_9SH$, $C_5H_{11}SH$, $C_6H_{13}SH$, $C_7H_{15}SH$, $C_8H_{17}SH$, $C_9H_{19}SH$, $C_{10}H_{21}SH$, $C_{11}H_{23}SH$, $C_{12}H_{25}SH$, $C_{13}H_{27}SH$, $C_{14}H_{29}SH$, $C_{15}H_{31}SH$, $C_{16}H_{33}SH$, $C_{17}H_{35}SH$, $C_{18}H_{37}SH$ and the like.

Additionally, the liquid for forming the water-repellent protecting film preferably contains a diluent solvent. In this case, the concentration of the water-insoluble surfactant in the liquid chemical for forming the protecting film is preferably not lower than 0.001 mass % relative to the total quantity of 100 mass % of the liquid chemical. If the concentration is lower than 0.001 mass %, the water repellency-providing effect tends to be insufficient. The concentration is more preferably not lower than 0.008 mass %. In further consideration of the cost of manufacturing of the liquid chemical, and the like, the concentration is preferably from 0.001 to 50 mass %, more preferably from 0.008 to 10 mass %.

Preferably usable examples of the organic solvent possibly contained in the water-insoluble surfactant in the liquid chemical for forming the protecting film are hydrocarbons, esters, ethers, ketones, halogen-element-containing solvents, sulfoxide-based solvents, alcohols, polyalcohol derivatives, nitrogen-element-containing solvents and the like.

Examples of hydrocarbons are toluene, benzene, xylene, hexane, heptane, octane and the like. Examples of esters are ethyl acetate, propyl acetate, butyl acetate, ethyl acetoacetate and the like. Examples of ethers are diethyl ether, dipropyl ether, dibutyl ether, tetrahydrofuran, dioxane and the like. Examples of ketones are acetone, acetylacetone, methyl ethyl ketone, methyl propyl ketone, methyl butyl ketone, and the like. Examples of the halogen-element-containing solvents are: perfluorocarbons such as perfluorooctane, perfluorononane, perfluorocyclopentane, perfluorocyclohexane, hexafluorobenzene and the like; hydrofluorocarbons such as 1,1,1,3,3-pentafluorobutane, octafluorocyclopentane, 2,3-dihydrodecafluoropentane, ZEORORA-H (produced by ZEON CORPORATION) and the like; hydrofluoroethers such as methyl perfluoroisobutyl ether, methyl perfluorobutyl ether, ethyl perfluorobutyl ether, ethyl perfluoroisobutyl ether, ASAHIKLIN AE-3000 (produced by Asahi Glass Co., Ltd.), Novec HFE-7100, Novec HFE-7200, Novec 7300, Novec 7600 (any of these are produced by 3M Limited) and the like; chlorocarbons such as tetrachloromethane and the like; hydrochlorocarbons such as chloroform and the like; chlorofluorocarbons such as dichlorodifluoromethane and the like; hydrochlorofluorocarbons such as 1,1-clicloro-2,2,3,3,3-pentafluoropropane, 1,3-dichloro-1,1,2,2,3-pentafluoropropane, 1-chloro-3,3,3-trifluoropropene, 1,2-dichloro-3,3,3-trifluoropropene and the like; perfluoroethers; perfluoropolyethers; and the like. Examples of the sulfoxide-based solvents are dimethyl sulfoxide and the like. Examples of the alcohols are methanol, ethanol, propanol, buthanol, ethylene glycol, 1,3-propanediol and the like. Examples of the polyalcohol derivatives are diethylene glycol monoethyl ether, ethylene glycol monomethyl ether, ethylene glycol monobutyl ether, propylene glycol monomethyl ether, propylene glycol monoethyl ether, diethylene glycol monoethyl ether acetate, ethylene glycol monomethyl ether acetate, ethylene glycol monobutyl ether acetate, propylene glycol monomethyl ether acetate, propylene glycol monoethyl ether acetate and the like. Examples of the nitrogen-element-containing solvents are formamide, N,N-dimethylformamide, N,N-dimethylacetamide, N-methyl-2-pyrrolidone, diethylamine, triethylamine, pyridine and the like.

Additionally, it is preferable to use a uninflammable one as the organic solvent, since the liquid chemical for forming the protecting film becomes uninflammable or increases in flash point so as to reduce the risk of the liquid chemical. Most of the halogen-element-containing solvents are uninflammable, and such a halogen-containing uninflammable solvent can be preferably used as an uninflammable organic solvent.

Additionally, in a case of using the water-insoluble surfactant represented by the general formula [1], an aprotic solvent is preferably used as the organic solvent to be mixed into the liquid chemical, since the functional moiety having affinity with the metal-based matter never be deactivated by the reaction with the solvent. Incidentally, the aprotic solvent includes both an aprotic polar solvent and an aprotic nonpolar solvent. Examples of such an aprotic solvent are hydrocarbons, esters, ethers, ketones, halogen-element-containing solvents, sulfoxide-based solvents, polyalcohol derivatives having no hydroxyl group, and nitrogen-element-containing solvents having no N—H bond.

Moreover, in order to accelerate the formation of the protecting film by the water-insoluble surfactant, a catalyst may be added to the liquid chemical for forming the protecting film. Examples of the catalyst include: acids containing no water, such as trifluoroacetic acid, trifluoroacetic anhydride, pentafluoropropionic acid, pentafluoropropionic anhydride, trifluoromethanesulfonic acid, trifluoromethanesulfonic anhydride, sulfuric acid, hydrogen chloride and the like; bases such as ammonia, alkylamine, dialkylamine and the like; salts such as ammonium sulfide, potassium acetate, methylhydroxyamine hydrochloride and the like; and a metallic complex or a metallic salt of tin, aluminum, titanium or the like.

The quantity of the catalyst to be added is preferably from 0.0001 to 200 mass % relative to the total quantity of 100 mass % of the liquid chemical for forming the protecting film. When the quantity to be added is small, the catalytic effect is reduced and therefore not preferable. Meanwhile, an excessively increased quantity to be added does not improve the catalytic effect, or rather raises a fear of eroding the wafer surface or remaining as impurity on the wafer, rather than improves the catalytic effect. It is, therefore, particularly preferable that the quantity of the catalyst to be added is from 0.001 to 50 mass %.

When increasing the temperature of the liquid chemical for forming the protecting film, the protecting film can be formed in a shorter time. A temperature at which a uniform protecting film can be readily formed is not lower than 10° C. and lower than the boiling point of the liquid chemical; and particularly, it is preferably not lower than 15° C. and not higher than a temperature lower than the boiling point of the liquid chemical by 10° C. It is preferable that the temperature of the liquid chemical is kept at the abovementioned temperature even when the liquid chemical is retained at least on the recessed portion of the uneven pattern.

The liquid chemical retained at least in the recessed portion of the uneven pattern may be substituted with a cleaning liquid B different from the liquid chemical (hereinafter referred to as "a cleaning liquid B") after the protecting film-forming step (a subsequent cleaning step). Subsequently to this, a drying step may be conducted. Examples of the cleaning liquid B include: the water-based cleaning liquid; the organic solvent; a mixture of the water-based cleaning liquid and the organic solvent; these into which at least one kind of acid and alkali is mixed; these in which the water-insoluble surfactant used in the liquid chemical for forming the protecting film is contained at a concentration lower than that in the liquid chemical; and the like. From the viewpoint of removing particles and metal impurities, it is more preferable that the cleaning liquid B is the water-based cleaning liquid, the organic solvent, or the mixture of the water-based cleaning liquid and the organic solvent. Furthermore, in the subsequent cleaning step, the liquid chemical for forming the protecting film retained in the recessed portion may undergo such a multistage cleaning liquid substitution as to be substituted with the cleaning liquid B other than the water-based cleaning liquid, for example, and then substituted with the water-based cleaning liquid. The subsequent cleaning step may subsequently shift to the drying step.

Moreover, it is particularly preferable to use the cleaning liquid B in which the water-insoluble surfactant used in the liquid chemical for forming the protecting film is contained at a concentration lower than that in the liquid chemical, unless it adversely affects removability of particles and metal impurities, because the water repellency of the wafer surface can be maintained even after conducting the subsequent cleaning step.

Incidentally, the protecting film formed on the wafer surface by the liquid chemical for forming the protecting film which liquid chemical contains the water-insoluble surfactant represented by the general formula [1] is hardly decreased in water repellency by the subsequent cleaning step. Therefore, it is not necessary to use the cleaning liquid containing the water-insoluble surfactant, in the subsequent cleaning step. Accordingly, in a case of conducting the protecting film-forming step in the use of the liquid chemical for forming the protecting film which liquid chemical contains the water-insoluble surfactant represented by these general formula [1], it is particularly preferable to be able to conduct the subsequent cleaning step for not shorter than 10 seconds even if the water-based cleaning liquid, the organic solvent or the mixture of the water-based cleaning liquid and the organic solvent which is preferable from the viewpoint of removing particles and metal impurities, is used as the cleaning liquid B at the time of performing the subsequent cleaning step after this step.

Examples of the organic solvent serving as one of the preferable examples of the cleaning liquid B are hydrocarbons, esters, ethers, ketones, halogen-element-containing solvents, sulfoxide-based solvents, alcohols, polyalcohol derivatives, nitrogen-element-containing solvents and the like.

Examples of hydrocarbons are toluene, benzene, xylene, hexane, heptane, octane and the like. Examples of esters are ethyl acetate, propyl acetate, butyl acetate, ethyl acetoacetate and the like. Examples of ethers are diethyl ether, dipropyl ether, &butyl ether, tetrahydrofuran, dioxane and the like. Examples of ketones are acetone, acetylacetone, methyl ethyl ketone, methyl propyl ketone, methyl butyl ketone, and the like. Examples of the halogen-element-containing solvents are: perfluorocarbons such as perfluorooctane, perfluorononane, perfluorocyclopentane, perfluorocyclohexane, hexafluorobenzene and the like; hydrofluorocarbons such as 1,1,1,3,3-pentafluorobutane, octafluorocyclopentane, 2,3-dihydrodecafluoropentane, ZEORORA-H (produced by ZEON CORPORATION) and the like; hydrofluoroethers such as methyl perfluoroisobutyl ether, methyl perfluorobutyl ether, ethyl perfluorobutyl ether, ethyl perfluoroisobutyl ether, ASAHIKLIN AE-3000 (produced by Asahi Glass Co., Ltd.), Novec HFE-7100, Novec HFE-7200, Novec 7300, Novec 7600 (any of these are produced by 3M Limited) and the like; chlorocarbons such as tetrachloromethane and the like; hydrochlorocarbons such as chloroform and the like; chlorofluorocarbons such as dichlorodifluoromethane and the like; hydrochlorofluorocarbons such as 1,1-dicloro-2,2,3,3,3-pentafluoropropane, 1,3-dichloro-1,1,2,2,3-pentafluoropropane, 1-chloro-3,3,3-trifluoropropene, 1,2-dichloro-3,3,3-trifuoropropene and the like; perfluoroethers; perfluoropolyethers; and the like. Examples of the sulfoxide-based solvents are dimethyl sulfoxide and the like. Examples of the alcohols are methanol, ethanol, propanol, buthanol, ethylene glycol, 1,3-propanediol and the like. Examples of the polyalcohol derivatives are diethylene glycol monoethyl ether, ethylene glycol monomethyl ether, ethylene glycol monobutyl ether, propylene glycol monomethyl ether, propylene glycol monoethyl ether, diethylene glycol monoethyl ether acetate, ethylene glycol monomethyl ether acetate, ethylene glycol monobutyl ether acetate, propylene glycol monomethyl ether acetate, propylene glycol monoethyl ether acetate and the like. Examples of the nitrogen-element-containing solvents are formamide, N,N-dimethylformamide, N,N-dimethylacetamide, N-methyl-2-pyrrolidone, diethylamine, triethylamine, pyridine and the like.

Figure 4:
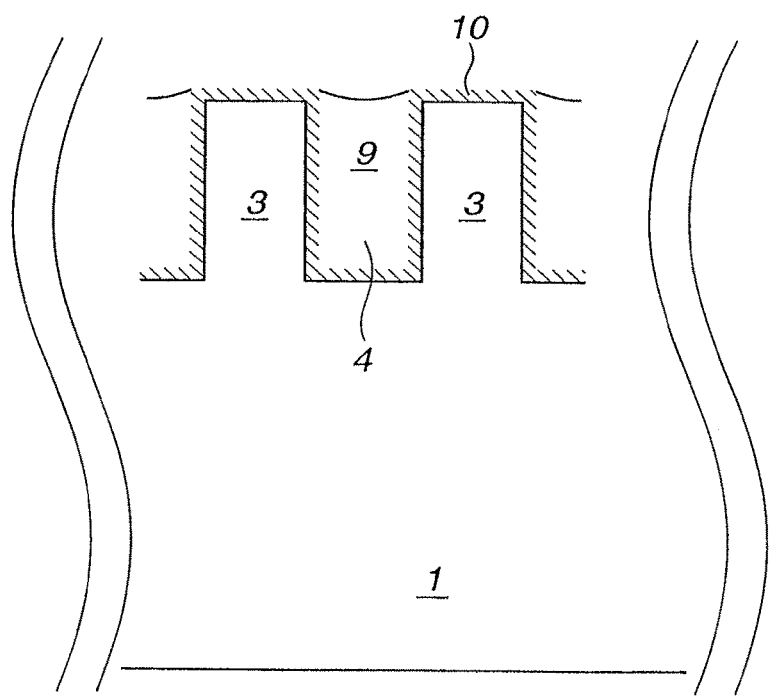
FIG. 4 A schematic view showing a condition where a liquid is retained in the recessed portions 4 on which the protecting film is formed.

A schematic view showing a condition where the liquid is retained in the recessed portions 4 provided with water repellency by the liquid chemical for forming the protecting film is shown in FIG. 4. The wafer as shown in the schematic view of FIG. 4 shows a part of an a-a' cross section in FIG. 1. The unevenly patterned surface is coated with a protecting film 10 by the liquid chemical thereby being provided with water repellency. Then, the protecting film 10 is retained on the wafer surface, also when the liquid 9 is removed from the unevenly patterned surface.

When the protecting film 10 is formed at least on the surface of the recessed portion of the uneven pattern of the wafer by the liquid chemical for forming the protecting film, a contact angle of from 50 to 130° on the assumption that water is retained on the surface is preferable because the pattern collapse becomes difficult to occur. The closer to 90° the contact angle is, the smaller the capillary force acting on the recessed portion becomes. It is therefore particularly preferable that the contact angle is from 70 to 110° because the pattern collapse is made further difficult to occur. Furthermore, the capillary force is preferably not higher than 2.1 $MN/m^2$. The capillary force of not higher than 2.1 $MN/m^2$ is preferable because the pattern collapse thereby becomes difficult to occur. Additionally, a lower capillary force makes the pattern collapse further difficult to occur, so that a capillary force of not higher than 1.1 $MN/m^2$ is particularly preferable. Furthermore, it is ideal to put the capillary force close to 0.0 $MN/m^2$ as much as possible by adjusting the contact angle to the liquid to around 90.

As discussed in the drying step, there is then conducted a step of removing the liquid retained in the recessed portions 4 on which the protecting film is formed by the liquid chemical, from the uneven pattern, by drying. At this time, the liquid retained in the recessed portions may be the liquid chemical used in the protecting film-forming step, the cleaning liquid B used in the subsequent cleaning step, or a mixture of these. The mixture, in which the water-insoluble surfactant contained in the liquid chemical for forming the protecting film is contained at a concentration lower than that in the liquid chemical, may be a liquid which is on the way to substitution of the liquid chemical with the cleaning liquid B, or a mixture liquid obtained by previously mixing the water-insoluble surfactant with the cleaning liquid B. In view of the cleanliness of the wafer, the particularly preferable are the water-based cleaning liquid, the organic solvent or the mixture of the water-based cleaning liquid and the organic solvent. Additionally, it is possible to bring the cleaning liquid B retained on the unevenly patterned surface after once removing liquid from the unevenly patterned surface and then dry it.

Incidentally, in a case of performing a cleaning treatment after a surface treatment with the liquid chemical (the subsequent cleaning step), a time for this step, i.e. a time to retain the cleaning liquid B is preferably not shorter than 10 seconds, more preferably not shorter than 20 seconds from the viewpoint of removing the particles and the metal impurities from the unevenly patterned surface. In view of the effect of maintaining a water-repellent performance of the protecting film formed on the unevenly patterned surface, it is preferable to use the cleaning liquid used in the subsequent cleaning step and containing the water-insoluble surfactant used in the liquid chemical for forming the protecting film, at a concentration lower than that in the liquid chemical, because the water repellency of the wafer surface can be maintained even after conducting the subsequent cleaning step. On the other hand, the time for the cleaning treatment can reduce the productivity if too long, and therefore is preferably not longer than 15 minutes.

In the drying step, liquid retained on the uneven pattern is removed by drying. The drying is preferably conducted by a conventionally known drying method such as spin drying, IPA (2-prop anol) steam drying, Marangoni drying, heating drying, warm air drying, vacuum drying and the like.

As discussed in the film-removing step, there is performed a step of conducting at least one treatment selected from irradiating the wafer surface with light, heating the wafer, and exposing the wafer to ozone, thereby removing the protecting film 10.

In the case where the protecting film 10 is removed by light irradiation, it is effective to cleave C—C bond and C—F bond in the protecting film 10. In order to achieve this, it is preferable to conduct an irradiation with ultraviolet rays having a wavelength of 340 nm and that of shorter than 240 nm (corresponding to bond energies of them, i.e., 83 kcal/mol and 116 kcal/mol). As the light source therefor, there is used a metal halide lamp, a low-pressure mercury lamp, a high-pressure mercury lamp, an excimer lamp, a carbon arc or the like. When using the metal halide lamp, the intensity of the ultraviolet irradiation is preferably not less than 100 $mW/cm^2$, particularly preferably not less than 200 $mW/cm^2$ in measurement value obtained by the illuminance meter (Intensity meter UM-10 produced by Konica Minolta Sensing, Inc., Light-Receptor UM-360 [Peak sensitivity wavelength: 365 nm, measured wavelength range: 310 to 400 nm]). Incidentally, an irradiation intensity of less than 100 $mW/cm^2$ takes a long time to remove the protecting film 10. When using the low-pressure mercury lamp, the ultraviolet irradiation is performed with shorter wavelengths so that removal of the protecting film 10 is achieved in a short time even if the intensity is low, which is preferable.

Additionally, in the case of removing the protecting film 10 by light irradiation, it is particularly preferable to generate ozone in parallel with decomposition of components of the protecting film 10 by ultraviolet rays and then to induce oxidation-volatilization of the components of the protecting film 10 by the ozone, since a treatment time is saved thereby. As the light source therefor, the low-pressure mercury lamp or the excimer lamp is used. Additionally, the wafer may be heated while being subjected to light irradiation.

In the case of heating the wafer, heating of the wafer is conducted at 400 to 700° C., preferably at 500 to 700° C. The heating time is preferably kept from 1 to 60 minutes, more preferably from 10 to 30 minutes. Additionally, this step may be conducted in combination with ozone exposure, plasma irradiation, corona discharge or the like. Additionally, the light irradiation may be conducted while heating the wafer.

As a method of removing the protecting film 10 by heating, a treatment where the wafer is set in an atmosphere heated by a heat treat furnace or the like is possible. This is an industrially advantageous method in which operations are conveniently accomplished in a short time with a high throughput, because energy for removing the protecting film 10 is readily and uniformly imparted to the wafer surface even in a case of treating multiple sheets of wafers.

In the case of exposing the wafer to ozone, it is preferable to provide ozone generated by ultraviolet irradiation using the low-pressure mercury lamp, low-temperature discharge using high voltages or the like, to the wafer surface. The wafer may be irradiated with light or heated while being exposed to ozone.

In the film-removing step, the protecting film can be efficiently removed by combining the above-mentioned light irradiation treatment, the heating treatment and the ozone-exposure treatment. Additionally, this step may be carried out in the use of plasma irradiation, corona discharge or the like.

EXAMPLES

To make a wafer surface into a surface having a finely uneven pattern and to substitute a cleaning liquid retained at least in recessed portions with another cleaning liquid have been studied variously as discussed in other literatures and the like, and therefore have already been established techniques. Accordingly, in the present invention, evaluations of a liquid chemical for forming a protecting film were mainly performed. Additionally, as apparent from the equation discussed in "BACKGROUND OF THE INVENTION"

$$P=2\times \gamma \times \cos \theta / S$$

($\gamma$: Surface tension, $\theta$: Contact angle, S: Pattern width), a pattern collapse greatly depends on the contact angle of the cleaning liquid to the wafer surface, i.e. the contact angle of liquid drop, and on the surface tension of the cleaning liquid. In a case of the cleaning liquid retained in recessed portions 4 of an uneven pattern 2, the contact angle of liquid drop and the capillary force which acts on the recessed portions and regarded as an equivalent of the pattern collapse are in correlation with each other, so that the capillary force may be derived from the equation and the evaluations on the contact angle of liquid drop to a protecting film 10. Incidentally, in Examples, a representative of a water-based cleaning liquid, i.e. water, was used as the cleaning liquid.

However, in a case of the wafer having a finely uneven pattern at its surface, the pattern is so significantly fine that it is not possible to exactly evaluate the contact angle of the protecting film 10 itself, the protecting film being formed on the unevenly patterned surface.

The evaluations of the contact angle of waterdrop is conducted by dropping several microliters of waterdrop on a surface of a sample (a substrate) and then by measuring an angle formed between the waterdrop and the substrate surface, as discussed in JIS R 3257 (Testing method of wettability of glass substrate surface). However, in the case of the wafer having a pattern, the contact angle is enormously large. This is because Wenzel's effect or Cassie effect is caused and because an apparent contact angle of waterdrop is increased under the influence of a surface shape (roughness) of the substrate upon the contact angle.

In view of the above, in the present invention, various evaluations are carried out by providing the liquid chemical to a wafer having a smooth surface to form the protecting film on the wafer surface and then by regarding the liquid chemical as the protecting film 10 formed on a surface of a wafer 1 at which surface a finely uneven pattern 2 is formed. Incidentally, in the present invention, "a wafer with a tungsten film" (represented by W in Tables) which has a tungsten layer on a silicon wafer having a smooth surface and "a wafer with a titanium nitride film" (represented by TiN in Tables) which has a titanium nitride layer on a silicon wafer having a smooth surface, were used as the wafer having the smooth surface.

Details will be discussed below. Hereinafter, there will be discussed: an evaluation method for a wafer to which the liquid chemical for forming the protecting film is provided; preparation of the liquid chemical for forming the protecting film; and evaluation results after providing the liquid chemical for forming the protecting film to the wafer.

[Evaluation Method for Wafer to which Liquid Chemical for Forming Protecting Film is Provided]

As an evaluation method for the wafer to which the liquid chemical for forming the protecting film is provided, the following evaluations (1) to (4) were performed.

(1) Evaluation of Contact Angle of Protecting Film Formed on Wafer Surface

Pure water of about 2 µl was dropped on a wafer surface on which a protecting film is formed, followed by measuring an angle (contact angle) formed between the waterdrop and the wafer surface by using a contact angle meter (produced by Kyowa Interface Science Co., Ltd.: CA-X Model). Here, a wafer having a contact angle of the protecting film within a range of from 50 to 130° was determined as an acceptable one.

(2) Evaluation of Capillary Force

The capillary force (the absolute value of P) was obtained by calculating P by using the following equation.

$$P=2\times \gamma \times \cos \theta / S$$

Here, $\gamma$ represents a surface tension, $\theta$ represents a contact angle, and S represents a pattern width. Incidentally, in a pattern having a line width of 45 nm, the pattern tends to collapse in a case where a cleaning liquid used when the gas-liquid interface passes through the pattern of the wafer is water. In a case of 2-propanol, the pattern tends to be difficult to collapse. If the wafer surface is titanium nitride or tungsten, for example, their contact angles of 2-propanol to the surface are both 0.5°, and similarly their contact angles of water are both 2°. Also concerning the other metal-based matters (titanium, aluminum, copper, tin, tantalum nitride, ruthenium and silicon), the contact angle is as much as the above. In a case where the wafer has a pattern width of 45 nm and a tungsten surface (the wafer with the tungsten film) or a titanium nitride surface (the wafer with the titanium nitride film), the capillary force is 0.98 MN/m² when the cleaning liquid is 2-propanol (whose surface tension is 22 mN/m). Furthermore, in a case of water (whose surface tension is 72 mN/m) having the largest surface tension among liquids other than mercury, the capillary force is 3.2 MN/m². Based on this, the midpoint 2.1 MN/m² was set as the target. The capillary force at the time of retaining water, of not larger than 2.1 MN/m² was defined as an acceptable one.

(3) Removability of Protecting Film

A sample was irradiated with UV rays from a metal halide lamp for 2 hours under the following conditions, followed by being evaluated in terms of removability of the protecting film at the film-removing step. The one who had a contact angle of waterdrop of not larger than 30° after the irradiation was defined as acceptable one.

Lamp: M015-L312 produced by EYE GRAPHICS CO., LTD. (Intensity: 1.5 kW)

Illuminance: 128 mW/cm² as a measurement value obtained under the following conditions Measuring Apparatus: Ultraviolet Intensity Meter (UM-10 produced by Konica Minolta Sensing, Inc.)

Light-Receptor: UM-360

(Light-Receptive Wavelength: 310-400 nm, Peak Wavelength: 365 nm)

Measuring Mode: Irradiance Measurement (4) Evaluation of Surface Smoothness of Wafer after Removing Protecting Film The surface was observed by atomic force microscope (produced by Seiko Instruments Inc.: SPI3700, 2.5 micrometer square scan). Then, there was obtained a difference ΔRa (nm) between the centerline average surface roughness Ra (nm) of the surface of the wafer before the cleaning and that after the cleaning. Incidentally, Ra is a three-dimensionally enlarged one obtained by applying the centerline average roughness defined by JIS B 0601 to a measured surface and is calculated as "an average value of absolute values of difference from standard surface to designated surface" from the following equation.

$$Ra = \frac{1}{S_0} \int_{Y_T}^{Y_B} \int_{X_L}^{X_R} |F(X, Y) - Z_0| dX\, dY \quad \text{[Chemical Formula 14]}$$

Here, $X_L$ and $X_R$, and $Y_B$ and $Y_T$ represent a measuring range in the X coordinate and the Y coordinate, respectively. So is an area on the assumption that the measured surface is ideally flat, and is a value obtained by $(X_R-X_L)\times(Y_B-Y_T)$. Additionally, F(X,Y) represents the height at a measured point (X,Y). $Z_0$ represents the average height within the measured surface.

The Ra value of the wafer surface before forming the protecting film and the Ra value of the wafer surface after removing the protecting film were measured. When a difference between them was within ±1 nm, the wafer surface was regarded as not being eroded by the cleaning and not leaving residues of the protecting film thereon, and therefore defined as an acceptable one.

Example 1

(I-1) Preparation of Liquid Chemical for Forming Protecting Film 3 g of octylamine [$C_8H_{17}NH_2$] having a HLB value of 2.5 and serving as a water-insoluble surfactant, and 97 g of toluene serving as an organic solvent were mixed and stirred for about 5 minutes, thereby obtaining a liquid chemical for forming a protecting film which liquid chemical has a concentration of the surfactant relative to the total quantity of the liquid chemical (hereinafter referred to as "a surfactant concentration") of 3 mass %.

(I-2) Cleaning of Wafer with Tungsten Film

As a pretreatment step 2, a wafer having a smooth tungsten film (a silicon wafer formed having a tungsten layer of 50 nm thickness on its surface) was immersed in 1 mass % aqueous ammonia for 1 minute, and then immersed in pure water for 1 minute. Furthermore, as a pretreatment step 3, the wafer was immersed in isopropyl alcohol (hereinafter referred to as "iPA") for 1 minute.

(I-3) Surface Treatment on Surface of Wafer Having Tungsten Film, with Liquid Chemical for Forming Protecting Film As a protecting film-forming step, the wafer with the tungsten film was immersed in the liquid chemical prepared in "(I-1) Preparation of liquid chemical for forming protecting film" section, at 20° C. for 10 minutes. Thereafter, the wafer having the tungsten film was immersed in iPA for 5 seconds, as a subsequent cleaning step. Then, as a drying step, the wafer with the tungsten film was taken out of iPA, followed by spraying air thereon to remove the iPA from the surface.

As a result of evaluating the obtained wafer having the tungsten film in a manner discussed in [Evaluation method for wafer to which liquid chemical for forming protecting film is provided] section, one having had an initial contact angle of smaller than 10° before the surface treatment changed to have a contact angle of 91° after the surface treatment, as shown in Table 1, thereby excellently exhibiting a water repellency-providing effect. Additionally, as a result of calculating the capillary force at the time of retaining water in the use of the equation discussed in "Evaluation of capillary force" section, the capillary force was so small as to be 0.06 $MN/m^2$. Additionally, the contact angle after UV irradiation was smaller than 10°, so that removal of the protecting film was achieved. Furthermore, the ΔRa value of the wafer after UV irradiation was within ±0.5 nm, with which it was confirmed that the wafer was not eroded at the time of cleaning and that residues of the protecting film did not remain after UV irradiation.

TABLE 1

| | Liquid chemical for forming protecting film | | | | Cleaning liquid for pretreatment step 3 | Protecting film-forming step | |
| --- | --- | --- | --- | --- | --- | --- | --- |
| | Water-insoluble surfactant | HLB | Organic solvent | Surfactant concentration [mass %] | Wafer | | Temperature [C.°] | Time [min] |
| Example 1 | $C_8H_{17}NH_2$ | 2.5 | Toluene | 3 | W | iPA | 20 | 10 |
| Example 2 | $C_8H_{17}NH_2$ | 2.5 | Toluene | 3 | W | iPA | 20 | 1 |
| Example 3 | $C_8H_{17}NH_2$ | 2.5 | PGMEA | 3 | W | iPA | 20 | 1 |
| Example 4 | $C_{10}H_{21}NH_2$ | 2.0 | PGMEA | 3 | W | iPA | 20 | 10 |
| Example 5 | $C_6H_{13}NH_2$ | 3.2 | PGMEA | 3 | W | iPA | 20 | 10 |
| Example 6 | $(C_6H_{13})_2NH$ | 1.6 | PGMEA | 3 | W | iPA | 20 | 10 |
| Example 7 | $C_8H_{17}NH_2$ | 2.5 | iPA | 3 | W | iPA | 20 | 10 |
| Example 8 | $C_8H_{17}NH_2$ | 2.5 | iPA | 3 | W | iPA | 20 | 1 |
| Example 9 | $C_8H_{17}NH_2$ | 2.5 | iPA | 0.1 | W | iPA | 20 | 1 |
| Example 10 | $C_8H_{17}NH_2$ | 2.5 | iPA | 0.01 | W | iPA | 20 | 1 |
| Example 11 | $C_8H_{17}NH_2$ | 2.5 | iPA | 0.005 | W | iPA | 20 | 1 |
| Example 12 | $C_8H_{17}NH_2$ | 2.5 | HFE-7100, iPA | 3 | W | iPA | 20 | 10 |
| Example 13 | $C_8H_{17}NH_2$ | 2.5 | DCTFP, iPA | 3 | W | iPA | 20 | 10 |
| Example 14 | $C_8H_{17}NH_2$ | 2.5 | CTFP, iPA | 3 | W | iPA | 20 | 10 |
| Example 15 | $C_8H_{17}NH_2$ | 2.5 | — | 100 | W | iPA | 20 | 1 |

TABLE 1-continued

| | | | | | | | | |
|---|---|---|---|---|---|---|---|---|
| Example 16 | Carbonate of $C_8H_{17}NH_2$ | — | iPA | 3 | W | iPA | 20 | 1 |
| Example 17 | $C_8H_{17}NH_2$ | 2.5 | Toluene | 3 | TiN | iPA | 20 | 10 |
| Example 18 | $C_8H_{17}NH_2$ | 2.5 | Toluene | 3 | TiN | iPA | 20 | 1 |
| Example 19 | $C_8H_{17}NH_2$ | 2.5 | PGMEA | 3 | TiN | iPA | 20 | 1 |
| Example 20 | $C_{10}H_{21}NH_2$ | 2.0 | PGMEA | 3 | TiN | iPA | 20 | 10 |
| Example 21 | $C_6H_{13}NH_2$ | 3.2 | PGMEA | 3 | TiN | iPA | 20 | 10 |
| Example 22 | $(C_6H_{13})_2NH$ | 1.6 | PGMEA | 3 | TiN | iPA | 20 | 10 |
| Example 23 | $C_8H_{17}NH_2$ | 2.5 | iPA | 3 | TiN | iPA | 20 | 10 |
| Example 24 | $C_8H_{17}NH_2$ | 2.5 | iPA | 3 | TiN | iPA | 20 | 1 |
| Example 25 | $C_8H_{17}NH_2$ | 2.5 | iPA | 0.1 | TiN | iPA | 20 | 1 |
| Example 26 | $C_8H_{17}NH_2$ | 2.5 | iPA | 0.01 | TiN | iPA | 20 | 1 |
| Example 27 | $C_8H_{17}NH_2$ | 2.5 | iPA | 0.005 | TiN | iPA | 20 | 1 |
| Example 28 | $C_8H_{17}NH_2$ | 2.5 | HFE-7100, iPA | 3 | TiN | iPA | 20 | 10 |
| Example 29 | $C_8H_{17}NH_2$ | 2.5 | DCTFP, iPA | 3 | TiN | iPA | 20 | 10 |
| Example 30 | $C_8H_{17}NH_2$ | 2.5 | CTFP, iPA | 3 | TiN | iPA | 20 | 10 |

| | Subsequent cleaning step | | Evaluation results | | | | |
|---|---|---|---|---|---|---|---|
| | Cleaning liquid for subsequent cleaning step | Time [sec] | Initial contact angle [°] | Contact angle after surface treatment ([°]) | Capillary force ([MN/m$^2$]) <Calculated value> | Removability of protecting film (Contact angle [°]) | Surface smoothness ($\Delta$Ra [nm]) |
| Example 1 | iPA | 5 | <10 | 91 | 0.06 | <10 | Within ±0.5 |
| Example 2 | iPA | 5 | <10 | 93 | 0.2 | <10 | Within ±0.5 |
| Example 3 | iPA | 5 | <10 | 89 | 0.06 | <10 | Within ±0.5 |
| Example 4 | iPA | 5 | <10 | 95 | 0.3 | <10 | Within ±0.5 |
| Example 5 | iPA | 5 | <10 | 87 | 0.2 | <10 | Within ±0.5 |
| Example 6 | iPA | 5 | <10 | 98 | 0.4 | <10 | Within ±0.5 |
| Example 7 | iPA | 5 | <10 | 90 | 0.0 | <10 | Within ±0.5 |
| Example 8 | iPA | 5 | <10 | 91 | 0.06 | <10 | Within ±0.5 |
| Example 9 | iPA | 5 | <10 | 91 | 0.06 | <10 | Within ±0.5 |
| Example 10 | iPA | 5 | <10 | 84 | 0.3 | <10 | Within ±0.5 |
| Example 11 | iPA | 5 | <10 | 78 | 0.7 | <10 | Within ±0.5 |
| Example 12 | iPA | 5 | <10 | 94 | 0.2 | <10 | Within ±0.5 |
| Example 13 | iPA | 5 | <10 | 93 | 0.2 | <10 | Within ±0.5 |
| Example 14 | iPA | 5 | <10 | 94 | 0.2 | <10 | Within ±0.5 |
| Example 15 | iPA | 5 | <10 | 92 | 0.1 | <10 | Within ±0.5 |
| Example 16 | iPA | 5 | <10 | 88 | 0.1 | <10 | Within ±0.5 |
| Example 17 | iPA | 5 | <10 | 85 | 0.3 | <10 | Within ±0.5 |
| Example 18 | iPA | 5 | <10 | 87 | 0.2 | <10 | Within ±0.5 |
| Example 19 | iPA | 5 | <10 | 84 | 0.3 | <10 | Within ±0.5 |
| Example 20 | iPA | 5 | <10 | 94 | 0.2 | <10 | Within ±0.5 |
| Example 21 | iPA | 5 | <10 | 86 | 0.2 | <10 | Within ±0.5 |
| Example 22 | iPA | 5 | <10 | 83 | 0.4 | <10 | Within ±0.5 |
| Example 23 | iPA | 5 | <10 | 83 | 0.4 | <10 | Within ±0.5 |
| Example 24 | iPA | 5 | <10 | 83 | 0.4 | <10 | Within ±0.5 |
| Example 25 | iPA | 5 | <10 | 82 | 0.4 | <10 | Within ±0.5 |
| Example 26 | iPA | 5 | <10 | 82 | 0.4 | <10 | Within ±0.5 |
| Example 27 | iPA | 5 | <10 | 73 | 0.9 | <10 | Within ±0.5 |
| Example 28 | iPA | 5 | <10 | 85 | 0.3 | <10 | Within ±0.5 |
| Example 29 | iPA | 5 | <10 | 86 | 0.2 | <10 | Within ±0.5 |
| Example 30 | iPA | 5 | <10 | 87 | 0.2 | <10 | Within ±0.5 |

Examples 2 to 16

The surface treatment of the wafer was conducted upon suitably modifying the conditions of Example 1 such as the water-insoluble surfactant, the organic solvent, the surfactant concentration, the time for the surface treatment and the like. Then, evaluation was carried out thereon. Results of them are shown in Table 1.

In Tables, "$C_{10}H_{21}NH_2$" means decylamine. "$C_6H_{13}NH_2$" means hexylamine. "$(C_6H_{13})_2NH$" means dihexylamine. "Carbonate of $C_8H_{17}NH_2$" means a carbonate of octylamine. The carbonate is a solid matter obtained by putting octylamine in a petri dish and then by exposing it to carbonic acid gas for 16 hours.

Moreover, in Tables, "PGMEA" means propylene glycol monomethyl ether acetate. "HFE-7100" means hydrofluoroether (HFE-7100 produced by 3M Limited). "HFE-7100, iPA" means a mixture solution in which HFE-7100:iPA is 85:12 in mass ratio. "DCTFP" means cis-1,2-clichloro-3,3,3-trifluoropropene. "DCTFP, iPA" means a mixture solution in which DCTFP:iPA is 85:12 in mass ratio. "CTFP" means 1-chloro-3,3,3-trifluoropropene. "CTFP, iPA" means a mixture solution in which CTFP:iPA is 85:12 in mass ratio.

Example 17

(II-1) Preparation of Liquid Chemical for Forming Protecting Film 3 g of octylamine [$C_8H_{17}NH_2$] having a HLB value of 2.5 and serving as a water-insoluble surfactant, and 97 g of toluene serving as an organic solvent were mixed and stirred for about 5 minutes, thereby obtaining a liquid chemical for forming a protecting film which liquid chemical has a surfactant concentration of 3 mass %.

(II-2) Cleaning of Wafer with Titanium Nitride Film

As a pretreatment step 2, a wafer having a smooth titanium nitride film (a silicon wafer formed having a titanium nitride layer of 50 nm thickness on its surface) was immersed in 1 mass % hydrogen peroxide aqueous solution for 1 minute, and then immersed in pure water for 1 minute. Furthermore, as a pretreatment step 3, the wafer was immersed in iPA for 1 minute.

(II-3) Surface Treatment on Surface of Wafer Having Titanium Nitride Film, with Liquid Chemical for Forming Protecting Film As a protecting film-forming step, the wafer with the titanium nitride film was immersed in the liquid chemical prepared in "(II-1) Preparation of liquid chemical for forming protecting film" section, at 20° C. for 10 minutes. Thereafter, the wafer having the titanium nitride film was immersed in iPA for 5 seconds, as a subsequent cleaning step. Then, as a drying step, the wafer with the titanium nitride film was taken out of iPA, followed by spraying air thereon to remove the iPA from the surface.

As a result of evaluating the obtained wafer having the titanium nitride film in a manner discussed in [Evaluation method for wafer to which liquid chemical for forming protecting film is provided] section, one having had an initial contact angle of smaller than 10° before the surface treatment changed to have a contact angle of 85° after the surface treatment, as shown in Table 1, thereby excellently exhibiting a water repellency-providing effect. Additionally, as a result of calculating the capillary force at the time of retaining water in the use of the equation discussed in "Evaluation of capillary force" section, the capillary force was so small as to be 0.3 MN/m². Additionally, the contact angle after UV irradiation was smaller than 10°, so that removal of the protecting film was achieved. Furthermore, the ΔRa value of the wafer after UV irradiation was within ±0.5 nm, with which it was confirmed that the wafer was not eroded at the time of cleaning and that residues of the protecting film did not remain after UV irradiation.

Examples 18 to 32

The surface treatment of the wafer was conducted upon suitably modifying the conditions of Example 17 such as the water-insoluble surfactant, the organic solvent, the surfactant concentration, the time for the surface treatment and the like. Then, evaluation was carried out thereon. Results of them are shown in Tables 1 and 2.

TABLE 2

| | Liquid chemical for forming protecting film | | | | Cleaning | Protecting film-forming step | |
| --- | --- | --- | --- | --- | --- | --- | --- |
| | Water-insoluble surfactant | HLB | Organic solvent | Surfactant concentration [mass %] | Wafer | liquid for pretreatment step 3 | Temperature [C.°] | Time [min] |
| Example 31 | $C_8H_{17}NH_2$ | 2.5 | — | 100 | TiN | iPA | 20 | 1 |
| Example 32 | Carbonate of $C_8H_{17}NH_2$ | — | iPA | 3 | TiN | iPA | 20 | 1 |
| Example 33 | $C_{11}H_{23}COCl$ | 5.8 | Toluene | 3 | W | PGMEA | 20 | 10 |
| Example 34 | $C_{11}H_{23}COCl$ | 5.8 | Toluene | 3 | W | PGMEA | 20 | 1 |
| Example 35 | $C_{11}H_{23}COCl$ | 5.8 | Toluene | 0.1 | W | PGMEA | 20 | 10 |
| Example 36 | $C_{11}H_{23}COCl$ | 5.8 | — | 100 | W | PGMEA | 20 | 10 |
| Example 37 | $C_{15}H_{31}COCl$ | 4.6 | Toluene | 3 | W | PGMEA | 20 | 10 |
| Example 38 | $C_7H_{15}COCl$ | 7.8 | Toluene | 3 | W | PGMEA | 20 | 10 |
| Example 39 | $C_{13}H_{27}COCl$ | 5.1 | Toluene | 3 | W | PGMEA | 20 | 10 |
| Example 40 | $C_{11}H_{23}COCl$ | 5.8 | Toluene | 3 | W | iPA | 20 | 10 |
| Example 41 | $C_{11}H_{23}COCl$ | 5.8 | HFE-7100, PGMEA | 3 | W | PGMEA | 20 | 10 |
| Example 42 | $C_{11}H_{23}COCl$ | 5.8 | HFE-7100, PGMEA | 3 | W | iPA | 20 | 10 |
| Example 43 | $C_{11}H_{23}COCl$ | 5.8 | HFE-7100, EGMEA | 3 | W | PGMEA | 20 | 10 |
| Example 44 | $C_{11}H_{23}COCl$ | 5.8 | ZEORORA-H, PGMEA | 3 | W | PGMEA | 20 | 10 |
| Example 45 | $C_{11}H_{23}COCl$ | 5.8 | DCTFP, PGMEA | 3 | W | PGMEA | 20 | 10 |
| Example 46 | $C_{11}H_{23}COCl$ | 5.8 | CTFP, PGMEA | 3 | W | PGMEA | 20 | 10 |
| Example 47 | $C_{11}H_{23}COCl$ | 5.8 | PGMEA | 3 | W | PGMEA | 20 | 10 |
| Example 48 | $C_{11}H_{23}COCl$ | 5.8 | PGMEA | 3 | W | iPA | 20 | 10 |
| Example 49 | $C_{15}H_{31}COCl$ | 4.6 | PGMEA | 3 | W | iPA | 20 | 1 |
| Example 50 | $C_{13}H_{27}COCl$ | 5.1 | Toluene | 3 | TiN | PGMEA | 20 | 10 |
| Example 51 | $C_{13}H_{27}COCl$ | 5.1 | Toluene | 3 | TiN | PGMEA | 20 | 1 |
| Example 52 | $C_{15}H_{31}COCl$ | 4.6 | Toluene | 3 | TiN | PGMEA | 20 | 10 |
| Example 53 | $C_7H_{15}COCl$ | 7.8 | Toluene | 3 | TiN | PGMEA | 20 | 10 |
| Example 54 | $C_{11}H_{23}COCl$ | 5.8 | Toluene | 3 | TiN | PGMEA | 20 | 10 |
| Example 55 | $C_{11}H_{23}COCl$ | 5.8 | Toluene | 3 | TiN | iPA | 20 | 1 |
| Example 56 | $C_{11}H_{23}COCl$ | 5.8 | Toluene | 0.1 | TiN | iPA | 20 | 1 |
| Example 57 | $C_{11}H_{23}COCl$ | 5.8 | HFE-7100, EGMEA | 3 | TiN | PGMEA | 20 | 10 |
| Example 58 | $C_{11}H_{23}COCl$ | 5.8 | HFE-7100, PGMEA | 3 | TiN | PGMEA | 20 | 10 |
| Example 59 | $C_{11}H_{23}COCl$ | 5.8 | HFE-7100, PGMEA | 3 | TiN | iPA | 20 | 10 |

TABLE 2-continued

| | | | | | | | | |
|---|---|---|---|---|---|---|---|---|
| Example 60 | $C_{13}H_{27}COCl$ | 5.1 | ZEORORA-H, EGMEA | 3 | TiN | PGMEA | 20 | 10 |
| Example 61 | $C_{13}H_{27}COCl$ | 5.1 | DCTFP, PGMEA | 3 | TiN | PGMEA | 20 | 10 |

| | Subsequent cleaning step | | Evaluation results | | | | |
|---|---|---|---|---|---|---|---|
| | Cleaning liquid for subsequent cleaning step | Time [sec] | Initial contact angle [°] | Contact angle after surface treatment ([°]) | Capillary force ([MN/m$^2$]) <Calculated value> | Removability of protecting film (Contact angle [°]) | Surface smoothness (ΔRa [nm]) |
| Example 31 | iPA | 5 | <10 | 82 | 0.4 | <10 | Within ±0.5 |
| Example 32 | iPA | 5 | <10 | 80 | 0.6 | <10 | Within ±0.5 |
| Example 33 | iPA | 5 | <10 | 89 | 0.06 | <10 | Within ±0.5 |
| Example 34 | iPA | 5 | <10 | 87 | 0.2 | <10 | Within ±0.5 |
| Example 35 | iPA | 5 | <10 | 83 | 0.4 | <10 | Within ±0.5 |
| Example 36 | iPA | 5 | <10 | 93 | 0.2 | <10 | Within ±0.5 |
| Example 37 | iPA | 5 | <10 | 92 | 0.1 | <10 | Within ±0.5 |
| Example 38 | iPA | 5 | <10 | 63 | 1.5 | <10 | Within ±0.5 |
| Example 39 | iPA | 5 | <10 | 89 | 0.06 | <10 | Within ±0.5 |
| Example 40 | iPA | 5 | <10 | 86 | 0.2 | <10 | Within ±0.5 |
| Example 41 | iPA | 5 | <10 | 81 | 0.5 | <10 | Within ±0.5 |
| Example 42 | iPA | 5 | <10 | 82 | 0.4 | <10 | Within ±0.5 |
| Example 43 | iPA | 5 | <10 | 75 | 0.8 | <10 | Within ±0.5 |
| Example 44 | iPA | 5 | <10 | 78 | 0.7 | <10 | Within ±0.5 |
| Example 45 | iPA | 5 | <10 | 84 | 0.3 | <10 | Within ±0.5 |
| Example 46 | iPA | 5 | <10 | 86 | 0.2 | <10 | Within ±0.5 |
| Example 47 | iPA | 5 | <10 | 74 | 0.9 | <10 | Within ±0.5 |
| Example 48 | iPA | 5 | <10 | 77 | 0.7 | <10 | Within ±0.5 |
| Example 49 | iPA | 5 | <10 | 82 | 0.4 | <10 | Within ±0.5 |
| Example 50 | iPA | 5 | <10 | 91 | 0.06 | <10 | Within ±0.5 |
| Example 51 | iPA | 5 | <10 | 94 | 0.2 | <10 | Within ±0.5 |
| Example 52 | iPA | 5 | <10 | 98 | 0.4 | <10 | Within ±0.5 |
| Example 53 | iPA | 5 | <10 | 61 | 1.6 | <10 | Within ±0.5 |
| Example 54 | iPA | 5 | <10 | 91 | 0.06 | <10 | Within ±0.5 |
| Example 55 | iPA | 5 | <10 | 89 | 0.06 | <10 | Within ±0.5 |
| Example 56 | iPA | 5 | <10 | 89 | 0.06 | <10 | Within ±0.5 |
| Example 57 | iPA | 5 | <10 | 73 | 0.9 | <10 | Within ±0.5 |
| Example 58 | iPA | 5 | <10 | 84 | 0.3 | <10 | Within ±0.5 |
| Example 59 | iPA | 5 | <10 | 86 | 0.2 | <10 | Within ±0.5 |
| Example 60 | iPA | 5 | <10 | 71 | 1.0 | <10 | Within ±0.5 |
| Example 61 | iPA | 5 | <10 | 70 | 1.1 | <10 | Within ±0.5 |

Example 33

(III-1) Preparation of Liquid Chemical for Forming Protecting Film 3 g of lauroyl chloride [$C_{11}H_{23}COCl$] having a HLB value of 5.8 and serving as a water-insoluble surfactant, and 97 g of toluene serving as an organic solvent were mixed and stirred for about 5 minutes, thereby obtaining a liquid chemical for forming a protecting film which liquid chemical has a surfactant concentration of 3 mass %.

(III-2) Cleaning of Wafer with Tungsten Film

As a pretreatment step 2, a wafer having a smooth tungsten film (a silicon wafer formed having a tungsten layer of 50 nm thickness on its surface) was immersed in 1 mass % aqueous ammonia in 1 minute, and then immersed in pure water for 1 minute. Furthermore, as a pretreatment step 3, the wafer was immersed in PGMEA for 1 minute.

(III-3) Surface Treatment on Surface of Wafer Having Tungsten Film, with Liquid Chemical for Forming Protecting Film As a protecting film-forming step, the wafer with the tungsten film was immersed in the liquid chemical prepared in "(III-1) Preparation of liquid chemical for forming protecting film" section, at 20° C. for 10 minutes. Thereafter, the wafer having the tungsten film was immersed in iPA for 5 seconds, as a subsequent cleaning step. Then, as a drying step, the wafer with the tungsten film was taken out of iPA, followed by spraying air thereon to remove the iPA from the surface.

As a result of evaluating the obtained wafer having the tungsten film in a manner discussed in [Evaluation method for wafer to which liquid chemical for forming protecting film is provided] section, one having had an initial contact angle of smaller than 10° before the surface treatment changed to have a contact angle of 89° after the surface treatment, as shown in Table 2, thereby excellently exhibiting a water repellency-providing effect. Additionally, as a result of calculating the capillary force at the time of retaining water in the use of the equation discussed in "Evaluation of capillary force" section, the capillary force was so small as to be 0.06 MN/m$^2$. Additionally, the contact angle after UV irradiation was smaller than 10°, so that removal of the protecting film was achieved. Furthermore, the ΔRa value of the wafer after UV irradiation was within ±0.5 nm, with which it was confirmed that the wafer was not eroded at the time of cleaning and that residues of the protecting film did not remain after UV irradiation.

Examples 34 to 49

The surface treatment of the wafer was conducted upon suitably modifying the conditions of Example 33 such as the water-insoluble surfactant, the organic solvent, the surfactant concentration, the solvent used in the pretreatment step 3, the time for the surface treatment and the like. Then, evaluation was carried out thereon. Results of them are shown in Table 2.

Incidentally, in Tables, "$C_{15}H_{31}COCl$" means palmitoyl chloride. "$C_7H_{15}COCl$" means octanoyl chloride. "$C_{13}H_{27}COCl$" means myristoyl chloride.

Moreover, in Tables, "HFE-7100, PGMEA" means a mixture solution in which HFE-7100: PGMEA is 90:7 in mass ratio. "EGMEA" means ethylene glycol monomethyl ether acetate. "HFE-7100, EGMEA" means a mixture solution in which HFE-7100:EGMEA is 90:7 in mass ratio. "ZEORORA-H" means 1,1,2,2,3,3,4-heptafluorocyclopentane (ZEORORA-H produced by ZEON CORPORATION). "ZEORORA-H, PGMEA" means a mixture solution in which ZEORORA-H:PGMEA is 90:7 in mass ratio. "DCTFP, PGMEA" means a mixture solution in which DCTFP:PGMEA is 90:7 in mass ratio. "CTFP, PGMEA" means a mixture solution in which CTFP:PGMEA is 90:7 in mass ratio.

In Examples 40, 42, 48 and 49, as "(III-2) Cleaning of wafer with tungsten film", a wafer having a tungsten film was immersed in 1 mass % aqueous ammonia for 1 minute and then immersed in pure water for 1 minute, as a pretreatment step 2. Thereafter, as a pretreatment step 3, the wafer was immersed in iPA for 1 minute.

Example 50

(IV-1) Preparation of Liquid Chemical for Forming Protecting Film 3 g of myristoyl chloride [$C_{13}H_{27}COCl$] having a HLB value of 5.1 and serving as a water-insoluble surfactant, and 97 g of toluene serving as an organic solvent were mixed and stirred for about 5 minutes, thereby obtaining a liquid chemical for forming a protecting film which liquid chemical has a surfactant concentration of 3 mass %.

(IV-2) Cleaning of Wafer with Titanium Nitride Film

As a pretreatment step 2, a wafer having a smooth titanium nitride film (a silicon wafer formed having a titanium nitride layer of 50 nm thickness on its surface) was immersed in 1 mass % hydrogen peroxide aqueous solution in 1 minute and then immersed in pure water for 1 minute. Furthermore, as a pretreatment step 3, the wafer was immersed in PGMEA for 1 minute.

(IV-3) Surface Treatment on Surface of Wafer Having Titanium Nitride Film, with Liquid Chemical for Forming Protecting Film As a protecting film-forming step, the wafer with the titanium nitride film was immersed in the liquid chemical prepared in "(IV-1) Preparation of liquid chemical for forming protecting film" section, at 20° C. for 10 minutes. Thereafter, the wafer having the titanium nitride film was immersed in iPA for 5 seconds, as a subsequent cleaning step. Then, as a drying step, the wafer with the titanium nitride film was taken out of iPA, followed by spraying air thereon to remove the iPA from the surface.

As a result of evaluating the obtained wafer having the titanium nitride film in a manner discussed in [Evaluation method for wafer to which liquid chemical for forming protecting film is provided] section, one having had an initial contact angle of smaller than 10° before the surface treatment changed to have a contact angle of 91° after the surface treatment, as shown in Table 2, thereby excellently exhibiting a water repellency-providing effect. Additionally, as a result of calculating the capillary force at the time of retaining water in the use of the equation discussed in "Evaluation of capillary force" section, the capillary force was so small as to be 0.06 $MN/m^2$. Additionally, the contact angle after UV irradiation was smaller than 10°, so that removal of the protecting film was achieved. Furthermore, the ΔRa value of the wafer after UV irradiation was within ±0.5 nm, with which it was confirmed that the wafer was not eroded at the time of cleaning and that residues of the protecting film did not remain after UV irradiation.

Examples 51 to 66

The surface treatment of the wafer was conducted upon suitably modifying the conditions of Example 50 such as the water-insoluble surfactant, the organic solvent, the surfactant concentration, the solvent used in the pretreatment step 3, the time for the surface treatment and the like. Then, evaluation was carried out thereon. Results of them are shown in Tables 2 and 3.

Incidentally, in Tables, "ZEORORA-H, EGMEA" means a mixture solution in which ZEORORA-H:EGMEA is 90:7 in mass ratio.

In Examples 55, 56, 59 and 64, as "(IV-2) Cleaning of wafer with titanium nitride film", a wafer having a titanium nitride film was immersed in 1 mass % hydrogen peroxide aqueous solution for 1 minute and then immersed in pure water for 1 minute, as a pretreatment step 2. Thereafter, as a pretreatment step 3, the wafer was immersed in iPA for 1 minute.

TABLE 3

| | Liquid chemical for forming protecting film | | | | | Cleaning liquid for pretreatment step 3 | Protecting film-forming step | |
|---|---|---|---|---|---|---|---|---|
| | Water-insoluble surfactant | HLB | Organic solvent | Surfactant concentration [mass %] | Wafer | | Temperature [C.°] | Time [min] |
| Example 62 | $C_{13}H_{27}COCl$ | 5.1 | CTFP, PGMEA | 3 | TiN | PGMEA | 20 | 10 |
| Example 63 | $C_{11}H_{23}COCl$ | 5.8 | PGMEA | 3 | TiN | PGMEA | 20 | 10 |
| Example 64 | $C_{11}H_{23}COCl$ | 5.8 | PGMEA | 3 | TiN | iPA | 20 | 10 |
| Example 65 | $C_{13}H_{27}COCl$ | 5.1 | — | 100 | TiN | PGMEA | 20 | 10 |
| Example 66 | $C_{15}H_{31}COCl$ | 4.6 | PGMEA | 3 | TiN | iPA | 20 | 1 |
| Example 67 | $C_{12}H_{25}NCO$ | 4.0 | Toluene | 3 | W | iPA | 20 | 1 |
| Example 68 | $C_{18}H_{37}NCO$ | 2.8 | Toluene | 3 | W | iPA | 20 | 1 |
| Example 69 | $C_{12}H_{25}NCO$ | 4.0 | Toluene | 3 | TiN | iPA | 20 | 1 |
| Example 70 | $C_{18}H_{37}NCO$ | 2.8 | Toluene | 3 | TiN | iPA | 20 | 1 |

TABLE 3-continued

| | | | | | | | | | |
|---|---|---|---|---|---|---|---|---|---|
| Example 71 | $C_8H_{17}NCO$ | 5.4 | Toluene | 3 | TiN | iPA | 20 | 1 |
| Example 72 | $C_8H_{17}NCO$ | 5.4 | PGMEA | 3 | TiN | iPA | 20 | 1 |
| Example 73 | $C_6H_{13}NCO$ | 6.6 | PGMEA | 3 | TiN | iPA | 20 | 1 |
| Example 74 | $C_8H_{17}SH$ | 4.5 | Toluene | 3 | TiN | iPA | 20 | 10 |
| Example 75 | $C_{12}H_{25}SH$ | 3.3 | Toluene | 3 | TiN | iPA | 20 | 10 |
| Example 76 | $C_7H_{15}COOH$ | 6.3 | PGMEA | 3 | TiN | iPA | 20 | 1 |
| Example 77 | $C_8H_{17}COOH$ | 5.7 | PGMEA | 3 | TiN | iPA | 20 | 1 |
| Example 78 | $(C_7H_{15}CO)_2O$ | 5.3 | PGMEA | 3 | TiN | iPA | 20 | 1 |
| Example 79 | $C_7H_{15}CHO$ | 4.5 | PGEMA | 3 | TiN | iPA | 20 | 1 |
| Example 80 | $C_5H_{11}C_4H_3S$ | 4.2 | PGMEA | 3 | TiN | iPA | 20 | 1 |
| Example 81 | $C_8H_{17}NH_2$ | 2.5 | iPA | 0.1 | W | iPA | 20 | 1 |
| Example 82 | $C_8H_{17}NH_2$ | 2.5 | iPA | 0.1 | TiN | iPA | 20 | 1 |
| Example 83 | $C_6H_{13}NH_2$ | 3.2 | Toluene | 3 | W | iPA | 20 | 10 |
| Example 84 | $C_6H_{13}NH_2$ | 3.2 | Toluene | 3 | TiN | iPA | 20 | 10 |
| Example 85 | $C_{11}H_{23}COCl$ | 5.8 | HFE-7100, PGMEA | 3 | TiN | iPA | 20 | 1 |
| Example 86 | $C_{11}H_{23}COCl$ | 5.8 | Toluene | 3 | TiN | iPA | 20 | 1 |
| Example 87 | $C_{15}H_{31}COCl$ | 4.6 | PGMEA | 3 | TiN | iPA | 20 | 1 |
| Example 88 | $C_{11}H_{23}COCl$ | 5.8 | HFE-7100, PGMEA | 3 | TiN | iPA | 20 | 1 |
| Example 89 | $C_{11}H_{23}COCl$ | 5.8 | Toluene | 3 | TiN | iPA | 20 | 1 |
| Example 90 | $C_{15}H_{31}COCl$ | 4.6 | PGMEA | 3 | TiN | iPA | 20 | 1 |

| | Subsequent cleaning step | | Evaluation results | | | |
|---|---|---|---|---|---|---|
| | Cleaning liquid for subsequent cleaning step | Time [sec] | Initial contact angle [°] | Contact angle after surface treatment ([°]) | Capillary force ([MN/m²]) <Calculated value> | Removability of protecting film (Contact angle [°]) | Surface smoothness (ΔRa [nm]) |
| Example 62 | iPA | 5 | <10 | 78 | 0.7 | <10 | Within ±0.5 |
| Example 63 | iPA | 5 | <10 | 80 | 0.6 | <10 | Within ±0.5 |
| Example 64 | iPA | 5 | <10 | 78 | 0.7 | <10 | Within ±0.5 |
| Example 65 | iPA | 5 | <10 | 93 | 0.2 | <10 | Within ±0.5 |
| Example 66 | iPA | 5 | <10 | 84 | 0.3 | <10 | Within ±0.5 |
| Example 67 | iPA | 5 | <10 | 79 | 0.6 | <10 | Within ±0.5 |
| Example 68 | iPA | 5 | <10 | 76 | 0.8 | <10 | Within ±0.5 |
| Example 69 | iPA | 5 | <10 | 99 | 0.5 | <10 | Within ±0.5 |
| Example 70 | iPA | 5 | <10 | 100 | 0.6 | <10 | Within ±0.5 |
| Example 71 | iPA | 5 | <10 | 72 | 1.0 | <10 | Within ±0.5 |
| Example 72 | iPA | 5 | <10 | 71 | 1.0 | <10 | Within ±0.5 |
| Example 73 | iPA | 5 | <10 | 71 | 1.0 | <10 | Within ±0.5 |
| Example 74 | iPA | 5 | <10 | 77 | 0.7 | <10 | Within ±0.5 |
| Example 75 | iPA | 5 | <10 | 69 | 1.1 | <10 | Within ±0.5 |
| Example 76 | iPA | 5 | <10 | 76 | 0.8 | <10 | Within ±0.5 |
| Example 77 | iPA | 5 | <10 | 70 | 1.1 | <10 | Within ±0.5 |
| Example 78 | iPA | 5 | <10 | 51 | 2.0 | <10 | Within ±0.5 |
| Example 79 | iPA | 5 | <10 | 50 | 2.1 | <10 | Within ±0.5 |
| Example 80 | iPA | 5 | <10 | 63 | 1.5 | <10 | Within ±0.5 |
| Example 81 | — | — | <10 | 91 | 0.06 | <10 | Within ±0.5 |
| Example 82 | — | — | <10 | 84 | 0.3 | <10 | Within ±0.5 |
| Example 83 | iPA | 5 | <10 | 85 | 0.3 | <10 | Within ±0.5 |
| Example 84 | iPA | 5 | <10 | 83 | 0.4 | <10 | Within ±0.5 |
| Example 85 | iPA | 60 | <10 | 83 | 0.4 | <10 | Within ±0.5 |
| Example 86 | iPA | 60 | <10 | 84 | 0.3 | <10 | Within ±0.5 |
| Example 87 | iPA | 60 | <10 | 81 | 0.5 | <10 | Within ±0.5 |
| Example 88 | iPA | 300 | <10 | 81 | 0.5 | <10 | Within ±0.5 |
| Example 89 | iPA | 300 | <10 | 83 | 0.4 | <10 | Within ±0.5 |
| Example 90 | iPA | 300 | <10 | 83 | 0.4 | <10 | Within ±0.5 |

Examples 67 to 82

The surface treatment of the wafer was conducted upon suitably modifying the conditions of Examples 1 to 32 such as the water-insoluble surfactant, the organic solvent, the surfactant concentration, the solvent used in the pretreatment step 3, the procedure for the surface treatment, the time for the surface treatment, and the like. Then, evaluation was carried out thereon. Results of them are shown in Table 3.

Incidentally, in Tables, "$C_{12}H_{25}NCO$" means dodecyl isocyanate. "$C_{18}H_{37}NCO$" means octadecyl isocyanate. "$C_8H_{17}NCO$" means octyl isocyanate. "$C_6H_{13}NCO$" means hexyl isocyanate. "$C_8H_{17}SH$" means octanethiol. "$C_{12}H_{25}SH$" means dodecanethiol. "$C_7H_{15}COOH$" means octanoic acid. "$C_8H_{17}COOH$" means nonanoic acid. "$(C_7H_{15}CO)_2O$" means octanoic anhydride. "$C_7H_{15}CHO$" means octylaldehyde. "$C_5H_{11}C_4H_3S$" means 2-pentylthiophene.

Additionally, in Example 81, in the drying step of "(I-3) Surface treatment on surface of wafer having tungsten film, with liquid chemical for forming protecting film", the wafer with tungsten film was taken out of the liquid chemical for forming the protecting film, followed by spraying air thereon to remove the liquid chemical for forming the protecting film, from the surface. In other words, the subsequent cleaning step was not conducted. Furthermore, in Example 82, in the drying step of "(II-3) Surface treatment on surface of wafer having titanium nitride film, with liquid chemical for forming protecting film", the wafer with titanium nitride film was taken out of the liquid chemical for forming the protecting film, followed by spraying air thereon to remove the liquid chemical for forming the protecting film, from the surface. In other words, the subsequent cleaning step was not conducted. Results of these are shown in Table 3.

Examples 83 and 84

The surface treatment of the wafer was conducted upon modifying the water-insoluble surfactant used in each of the above-mentioned Examples 1 and 17. Then, evaluations were carried out on them. Results thereof are shown in Table 3. Incidentally, in Tables, "$C_6H_{13}NH_2$" means hexylamine.

Examples 85 to 90

The surface treatment of the wafer was conducted upon suitably modifying the conditions of each of Examples 50 to 66 such as the water-insoluble surfactant, the organic solvent, the surfactant concentration, the solvent used in the pretreatment step 3, the procedure of the surface treatment, the time for the surface treatment, the time for the subsequent cleaning and the like. Then, evaluation was carried out thereon. Results thereof are shown in Table 3.

Examples 91 and 92

The surface treatment of the wafer was conducted upon suitably modifying the conditions of Example 24 such as the time for the subsequent cleaning, the cleaning liquid used in the subsequent cleaning step, and the like. Then, evaluation was carried out thereon. Results thereof are shown in Table 4.

TABLE 4

| | Liquid chemical for forming protecting film | | | | Cleaning | Protecting film-forming step | |
| --- | --- | --- | --- | --- | --- | --- | --- |
| | Water-insoluble surfactant | HLB | Organic solvent | Surfactant concentration [mass %] | Wafer | liquid for pretreatment step 3 | Temperature [C.°] | Time [min] |
| Example 91 | $C_8H_{17}NH_2$ | 2.5 | iPA | 3 | TiN | iPA | 20 | 1 |
| Example 92 | $C_8H_{17}NH_2$ | 2.5 | iPA | 3 | TiN | iPA | 20 | 1 |
| Example 93 | $C_8H_{17}NH_2$ | 2.5 | iPA | 3 | TiN | iPA | 20 | 1 |

| | Subsequent cleaning step | | Evaluation results | | | | |
| --- | --- | --- | --- | --- | --- | --- | --- |
| | Cleaning liquid for subsequent cleaning step | Time [sec] | Initial contact angle [°] | Contact angle after surface treatment ([°]) | Capillary force ([MN/m²]) <Calculated value> | Removability of protecting film (Contact angle [°]) | Surface smoothness (ΔRa [nm]) |
| Example 91 | iPA | 15 | <10 | 51 | 2.0 | <10 | Within ±0.5 |
| Example 92 | 0.0008 mass % iPA solution of $C_8H_{17}NH_2$ | 60 | <10 | 79 | 0.6 | <10 | Within ±0.5 |
| Example 93 | iPA | 5 | <10 | 83 | 0.4 | <10 | Within ±0.5 |

Example 93

The same treatment as Example 24 was performed with the exception that the sample was disposed on a hot plate tempered to 300° C. and then subjected to a heat treatment for 5 minutes as the method for removing the protecting film. Then, evaluation was carried out thereon. Results thereof are shown in Table 4.

Comparative Example 1

The procedure was the same as Example 1 with the exception that the liquid chemical for forming the protecting film was not provided to the wafer having the tungsten film. In other words, in the present Comparative Example, a wafer surface on which the protecting film was not formed was evaluated. The result of the evaluation is as shown in Table 5, in which the contact angle was so small as to be 14° and additionally the capillary force at the time of retaining water was so large as to be 3.1 MN/m².

TABLE 5

| | Liquid chemical for forming protecting film | | | | | Protecting film-forming step | |
|---|---|---|---|---|---|---|---|
| | Protecting film-forming agent | HLB | Protecting film-forming agent Organic solvent | concentration [mass %] | Wafer | Cleaning liquid for pretreatment step 3 | Temperature [C.°] | Time [min] |
| Comparative Example 1 | — | | — | — | W | iPA | — | — |
| Comparative Example 2 | $(CH_3)_3SiCl$ | | Toluene | 3 | W | PGMEA | 20 | 10 |
| Comparative Example 3 | — | | — | — | TiN | iPA | — | — |
| Comparative Example 4 | $(CH_3)_3SiCl$ | | Toluene | 3 | TiN | PGMEA | 20 | 10 |
| Comparative Example 5 | ALSCOAP-TH330 | >10 | iPA | 3 | TiN | iPA | 20 | 10 |
| Comparative Example 6 | $[(CH_3)_3Si]_2NH$ | | Toluene | 3 | W | PGMEA | 20 | 10 |
| Comparative Example 7 | $(CH_3)_3SiN(CH_3)_2$ | | DGDE | 3 | W | PGMEA | 20 | 10 |
| Comparative Example 8 | $[(CH_3)_3Si]_2NH$ | | Toluene | 3 | TiN | PGMEA | 20 | 10 |
| Comparative Example 9 | $(CH_3)_3SiN(CH_3)_2$ | | DGDE | 3 | TiN | PGMEA | 20 | 10 |
| Comparative Example 10 | $(C_2H_5)_2NH$ | 3.6 | Toluene | 3 | TiN | iPA | 20 | 10 |

| | Subsequent cleaning step | | Evaluation results | | | | |
|---|---|---|---|---|---|---|---|
| | Cleaning liquid for subsequent cleaning step | Time [sec] | Initial contact angle [°] | Contact angle after surface treatment ([°]) | Capillary force ([MN/m²]) <Calculated value> | Removability of protecting film (Contact angle [°]) | Surface smoothness (ΔRa [nm]) |
| Comparative Example 1 | iPA | 5 | <10 | 14 | 3.1 | — | — |
| Comparative Example 2 | iPA | 5 | <10 | 13 | 3.1 | — | — |
| Comparative Example 3 | iPA | 5 | <10 | 14 | 3.1 | — | — |
| Comparative Example 4 | iPA | 5 | <10 | 18 | 3.0 | — | — |
| Comparative Example 5 | iPA | 5 | <10 | 13 | 3.1 | — | — |
| Comparative Example 6 | iPA | 5 | <10 | 7 | 3.2 | — | — |
| Comparative Example 7 | iPA | 5 | <10 | 9 | 3.2 | — | — |
| Comparative Example 8 | iPA | 5 | <10 | 19 | 3.0 | — | — |
| Comparative Example 9 | iPA | 5 | <10 | 22 | 3.0 | — | — |
| Comparative Example 10 | iPA | 5 | <10 | 21 | 3.0 | — | — |

Comparative Example 2

First of all, 3 g of trimethylsilyl chloride [$(CH_3)_3SiCl$] which is a silane coupling agent serving as a protecting film-forming agent, and 97 g of toluene serving as an organic solvent were mixed and stirred for about 5 minutes, thereby obtaining a liquid chemical for forming a protecting film which liquid chemical has a concentration of the silane coupling agent relative to the total quantity of the mixture solution, of 3 mass %. Then, the cleaning and the surface treatment were conducted on the wafer having the tungsten film by the same method as Example 33. The result of the evaluation is as shown in Table 5. The contact angle after the surface treatment was 13°, and a water repellency-providing effect was not confirmed. Meanwhile, the capillary force at the time of retaining water was so large as to be 3.1 MN/m².

Comparative Example 3

The procedure was the same as Example 17 with the exception that the liquid chemical for forming the protecting film was not provided to the wafer having the titanium nitride film. In other words, in the present Comparative Example, a wafer surface on which the protecting film was not formed was evaluated. The result of the evaluation is as shown in Table 5, in which the contact angle was so small as to be 14° and additionally the capillary force at the time of retaining water was so large as to be 3.1 MN/m².

Comparative Example 4

First of all, 3 g of trimethylsilyl chloride [$CH_3)_3SiCl$] which is a silane coupling agent serving as a protecting film-forming agent, and 97 g of toluene serving as an organic solvent were mixed and stirred for about 5 minutes, thereby obtaining a liquid chemical for forming a protecting film which liquid chemical has a concentration of the silane coupling agent relative to the total quantity of the mixture solution, of 3 mass %. Then, the cleaning and the surface treatment were conducted on the wafer having the titanium nitride film by the same method as Example 50. The result of the evaluation is as shown in Table 5. The contact angle after the surface treatment was 18°, and a water repellency-providing effect was not confirmed. Meanwhile, the capillary force at the time of retaining water was so large as to be 3.0 MN/m$^2$.

Comparative Example 5

The procedure was the same as Example 17 with the exception that sodium polyoxyethylene lauryl ether sulfate (ALSCOAP TH-330 produced by TOHO Chemical Industry Co., Ltd.) which has an estimated HLB value exceeding 10 and serves as a water-soluble surfactant was used as the protecting film-forming agent in the liquid chemical for forming the protecting film and that iPA was used as the organic solvent in the liquid chemical for forming the protecting film. The result of the evaluation is as shown in Table 5. The contact angle after the surface treatment was 13°, and a water repellency-providing effect was not confirmed. Additionally, the capillary force at the time of retaining water was so large as to be 3.1 MN/m$^2$.

Comparative Example 6

First of all, 3 g of hexamethylthsilazane [$[(CH_3)_3Si]2NH$] which is a silane coupling agent serving as a protecting film-forming agent, and 97 g of toluene serving as an organic solvent were mixed and stirred for about 5 minutes, thereby obtaining a liquid chemical for forming a protecting film having a concentration of the silane coupling agent relative to the total quantity of the mixture solution, of 3 mass %. Then, the cleaning and the surface treatment were conducted on the wafer having the tungsten film by the same method as Example 33. The result of the evaluation is as shown in Table 5. The contact angle after the surface treatment was 7°, and a water repellency-providing effect was not confirmed. Additionally, the capillary force at the time of retaining water was so large as to be 3.2 MN/m$^2$.

Comparative Example 7

First of all, 3 g of trimethylsilyl dimethylamine [$(CH_3)_3SiN(CH_3)_2$] which is a silane coupling agent serving as a protecting film-forming agent, and 97 g of diethylene glycol diethyl ether (hereinafter referred to as "DGDE") serving as an organic solvent were mixed and stirred for about 5 minutes, thereby obtaining a liquid chemical for forming a protecting film having a concentration of the silane coupling agent relative to the total quantity of the mixture solution, of 3 mass %. Then, the cleaning and the surface treatment were conducted on the wafer having the tungsten film by the same method as Example 33. The result of the evaluation is as shown in Table 5. The contact angle after the surface treatment was 9°, and a water repellency-providing effect was not confirmed. Additionally, the capillary force at the time of retaining water was so large as to be 3.2 MN/m$^2$.

Comparative Example 8

First of all, 3 g of hexamethyldisilazane [$[(CH_3)_3Si]_2NH$] which is a silane coupling agent serving as a protecting film-forming agent, and 97 g of toluene serving as an organic solvent were mixed and stirred for about 5 minutes, thereby obtaining a liquid chemical for forming a protecting film having a concentration of the silane coupling agent relative to the total quantity of the mixture solution, of 3 mass %. Then, the cleaning and the surface treatment were conducted on the wafer having the titanium nitride film by the same method as Example 50. The result of the evaluation is as shown in Table 5. The contact angle after the surface treatment was 19°, and a water repellency-providing effect was not confirmed. Additionally, the capillary force at the time of retaining water was so large as to be 3.0 MN/m$^2$.

Comparative Example 9

First of all, 3 g of trimethylsilyl dimethylamine [$(CH_3)_3SiN(CH_3)_2$] which is a silane coupling agent serving as a protecting film-forming agent, and 97 g of DGDE serving as an organic solvent were mixed and stirred for about 5 minutes, thereby obtaining a liquid chemical for forming a protecting film having a concentration of the silane coupling agent relative to the total quantity of the mixture solution, of 3 mass %. Then, the cleaning and the surface treatment were conducted on the wafer having the titanium nitride film by the same method as Example 50. The result of the evaluation is as shown in Table 5. The contact angle after the surface treatment was 22°, and a water repellency-providing effect was not confirmed. Additionally, the capillary force at the time of retaining water was so large as to be 3.0 MN/m$^2$.

Comparative Example 10

First of all, 3 g of diethylamine [$(C_2H_5)_2NH$] which is a water soluble surfactant and serves as a protecting film-forming agent, and 97 g of toluene serving as an organic solvent were mixed and stirred for about 5 minutes, thereby obtaining a liquid chemical for forming a protecting film having a concentration of the water-soluble surfactant relative to the total quantity of the mixture solution, of 3 mass %. Then, the cleaning and the surface treatment were conducted on the wafer having the titanium nitride film by the same method as Example 17. The result of the evaluation is as shown in Table 5. The contact angle after the surface treatment was 21°, and a water repellency-providing effect was not confirmed. Additionally, the capillary force at the time of retaining water was so large as to be 3.0 MN/m$^2$.

EXPLANATION OF REFERENCE NUMERALS

1 Wafer
2 Finely uneven pattern on a wafer surface
3 Projected portions of the pattern
4 Recessed portions of the pattern
5 Width of the recessed portions
6 Height of the projected portions
7 Width of the projected portions
8 Liquid chemical for forming a protecting film, retained in the recessed portions 4
9 Liquid retained in the recessed portions 4
10 Protecting film

The invention claimed is:

1. A process for cleaning a wafer which has at its surface a finely uneven pattern formed with a recessed portion and contains at least at a part of a surface of the recessed portion of the uneven pattern at least one kind of matter selected from the group consisting of titanium, titanium nitride, tungsten, aluminum, copper, tin, tantalum nitride, ruthenium and silicon, the process comprising:
    a protecting film-forming step of retaining a liquid chemical for forming a protecting film at least in the recessed portion of the uneven pattern;
    a drying step of drying the uneven pattern; and
    a film-removing step of removing the protecting film,
    wherein the liquid chemical for forming the protecting film contains a water-repellent-protecting-film-forming agent for forming a water-repellent film at least on the surface of the recessed portion and that the water-repellent-protecting-film-forming agent is a water-insoluble surfactant,
    wherein the water-insoluble surfactant is selected from the group consisting of general formula [1], the general formula [2], and salt compounds thereof,

[1]

where $R^1$ represents one of a monovalent organic group having hydrocarbon group whose carbon number is 1 to 18 and a monovalent organic group having a fluoroalkyl chain whose carbon number is 1 to 8, and U represents a group selected from the group consisting of fluoro group, chloro group, bromo group and iodo group, $$R^2R^3R^4N \qquad [2]$$

where $R^2$ represents one of a monovalent organic group having hydrocarbon group whose carbon number is 1 to 18 and a monovalent organic group having a fluoroalkyl chain whose carbon number is 1 to 8; $R^3$ represents one of hydrogen atom, a monovalent organic group having hydrocarbon group whose carbon number is 1 to 18, and a monovalent organic group having a fluoroalkyl chain whose carbon number is 1 to 8; and $R^4$ represents one of hydrogen atom, a monovalent organic group having hydrocarbon group whose carbon number is 1 to 18, and a monovalent organic group having a fluoroalkyl chain whose carbon number is 1 to 8.

2. A cleaning process as claimed in claim 1, wherein removal of the water-repellent protecting film in the film-removing step is carried out by at least one treatment selected from irradiating the wafer surface with light, heating the wafer, and exposing the wafer to ozone.

3. A cleaning process as claimed in claim 1, wherein the water-insoluble surfactant has an HLB value obtained by Griffin's method of from 0.001 to 10.

4. A cleaning process as claimed in claim 1, wherein the water-insoluble surfactant is at least one kind selected from the group consisting of: a compound in which $R^1$ is a monovalent organic group having hydrocarbon group whose carbon number is 8 to 18 in the water-insoluble surfactant represented by the general formula [1]; a compound in which $R^2$ is a monovalent organic group having hydrocarbon group whose carbon number is 6 to 18, $R^3$ is one of a hydrogen atom and a monovalent organic group having hydrocarbon group whose carbon number is 1 to 18, and $R^4$ is one of a hydrogen atom and a monovalent organic group having hydrocarbon group whose carbon number is 1 to 18, in the water-insoluble surfactant represented by the general formula [2]; and a salt compound thereof.

5. A cleaning process as claimed in claim 1, wherein the liquid chemical for forming the water-repellent protecting film contains a diluent solvent.

6. A cleaning process as claimed in claim 1, wherein removal of the water-repellent protecting film in the film-removing step is carried out by heating the wafer.

7. A cleaning process as claimed in claim 1, wherein removal of the water-repellent protecting film in the film-removing step is carried out by heating the wafer at not higher than 300° C.

8. A cleaning process as claimed in claim 1, further comprising a subsequent cleaning step of substituting the liquid chemical for forming the protecting film with a cleaning liquid different from the liquid chemical, between the protecting film-forming step and the drying step, wherein the cleaning liquid is at least one kind selected from the group consisting of: a water-based cleaning liquid; an organic solvent; a mixture of the water-based cleaning liquid and the organic solvent, wherein the water-insoluble surfactant is present in the cleaning liquid at a concentration lower than that in the liquid chemical.

9. A cleaning process as claimed in claim 8, wherein the cleaning liquid substituted in the subsequent cleaning step is retained for not shorter than 10 seconds.

* * * * *